(12) United States Patent
Hoover

(10) Patent No.: US 11,847,842 B2
(45) Date of Patent: Dec. 19, 2023

(54) SYSTEMS AND METHOD FOR TEXTILE FABRIC CONSTRUCTION

(71) Applicant: Black Swan Textiles, Oxford, OH (US)

(72) Inventor: Keith Hoover, Oxford, OH (US)

(73) Assignee: BLACK SWAN TEXTILES, Oxford, OH (US)

( * ) Notice: Subject to any disclaimer, the term of this patent is extended or adjusted under 35 U.S.C. 154(b) by 61 days.

(21) Appl. No.: 17/453,976

(22) Filed: Nov. 8, 2021

(65) Prior Publication Data

US 2022/0147734 A1 May 12, 2022

Related U.S. Application Data

(60) Provisional application No. 63/112,814, filed on Nov. 12, 2020.

(51) Int. Cl.
*G06V 20/64* (2022.01)
*D04B 15/66* (2006.01)

(52) U.S. Cl.
CPC .......... *G06V 20/647* (2022.01); *D04B 15/66* (2013.01)

(58) Field of Classification Search
USPC ................................................ 382/154–156
See application file for complete search history.

(56) References Cited

U.S. PATENT DOCUMENTS

| | | | |
|---|---|---|---|
| 2017/0011551 A1* | 1/2017 | Jeong | G06V 10/752 |
| 2018/0225993 A1* | 8/2018 | Buras | A61B 34/20 |
| 2020/0126316 A1* | 4/2020 | Sharma | G06T 17/20 |
| 2020/0402126 A1* | 12/2020 | Choche | A41H 3/007 |
| 2022/0180066 A1* | 6/2022 | Wu | G06N 20/00 |

OTHER PUBLICATIONS

Kaspar et al. Neural Inverse Knitting: From Images to Manufacturing Instructions, ARXIV ID: 1902.02752 Publication Date: Feb. 7, 2019 (Year: 2019).*
"International Application Serial No. PCT/US2021/072284, Invitation to Pay Additional Fees dated Feb. 16, 2022", 13 pgs.
Trunz, Elena, et al., "Inverse Procedural Modeling of Knitwear", 2019 IEEE/CVF Conference on Computer Vision and Pattern Recognition (CVPR), Los Alamitos, CA, USA, (Jun. 15, 2019), 8622-8631.
"International Application Serial No. PCT/US2021/072284, International Preliminary Report on Patentability dated May 25, 2023", 15 pgs.
"International Application Serial No. PCT/US2021/072284, International Search Report dated Apr. 7, 2022", 5 pgs.
"International Application Serial No. PCT/US2021/072284, Written Opinion dated Apr. 7, 2022", 13 pgs.

* cited by examiner

*Primary Examiner* — Ishrat I Sherali
(74) *Attorney, Agent, or Firm* — SCHWEGMAN LUNDBERG & WOESSNER, P.A.

(57) ABSTRACT

Disclosed herein are systems and methods that allow an image of a fabric sample to be captured. The image may be analyzed to extract features, sometimes referred to as a stitch parameter, of the fabric's construction, such the use of one or more stitch types. Using the stitch parameters, a build specification can be selected from a plurality of build specification. Each of the plurality of build specifications may be associated with at least one of a plurality of known fabric constructions. The build specification may be exported and then used to construct a fabric similar to the fabric sample captured in the received image.

17 Claims, 16 Drawing Sheets

MASTER SHEET — 1100

| FILENAME | C1 W1 | C1 W2 | C1 W4 | C2 W1 | C2 W2 | C2 W3 | C2 W4 | C3 W1 | C3 W2 | C3 W3 | C3 W4 | C4 W1 | C4 W2 | C4 W3 | C4 W4 |
|---|---|---|---|---|---|---|---|---|---|---|---|---|---|---|---|
| 29X42_4X4_296_SMOOTH_B_M.PNG | 1 | 16 | 1 | 1 | 1 | 16 | 1 | 1 | 1 | 1 | 1 | 1 | 1 | 1 | 1 |
| 29X42_4X4_2_SMOOTH_B_M.PNG | 1 | 1 | 1 | 16 | 1 | 1 | 1 | 1 | 1 | 1 | 1 | 1 | 1 | 1 | 1 |
| 29X42_4X4_314_SMOOTH_B_M.PNG | 1 | 16 | 16 | 1 | 16 | 16 | 16 | 1 | 1 | 1 | 1 | 1 | 1 | 1 | 1 |
| 29X42_4X4_318_SMOOTH_B_M.PNG | 1 | 16 | 16 | 16 | 1 | 1 | 16 | 1 | 1 | 1 | 1 | 1 | 1 | 1 | 1 |
| 23X52_4X4_102_SMOOTH_B_T.PNG | 1 | 1 | 11 | 11 | 11 | 1 | 1 | 1 | 1 | 1 | 1 | 1 | 1 | 1 | 1 |
| 23X52_4X4_103_SMOOTH_B_M.PNG | 1 | 11 | 11 | 11 | 1 | 11 | 1 | 1 | 1 | 1 | 1 | 1 | 1 | 1 | 1 |
| 23X52_4X4_17_SMOOTH_B_T.PNG | 1 | 1 | 1 | 1 | 11 | 1 | 1 | 1 | 1 | 1 | 1 | 1 | 1 | 1 | 1 |

WPI/CPI META SHEET — 1300

| FILENAME | WPI | CPI |
|---|---|---|
| 23X52_4X4_296_SMOOTH_B_M.PNG | 23 | 52 |
| 16X24_4X4_314_SMOOTH_B_M.PNG | 16 | 24 |
| 18X30_4X4_318_SMOOTH_B_M.PNG | 18 | 30 |

← → O ⚠ NOT SURE | 10.10.100.42:3000/UPLOAD  Q ⊘ ⓘ ☆ ● ⦿
⦿ ADMIN ▽

BLACKOPS FABRIC DECODER: BFD
WHAT YOU WANT IS WHAT YOU GET

CONSTRUCTION
DETAILS

BASIC INFORMATION
FILE NAME: Evaluation_Sample.jpg
SIZE: 3599 PIXELS
CONTENT TYPE: IMAGE
FILE TYPE: PNG

DERIVED INFORMATION — 1404
STITCH TYPE: TUCK
STITCH SEQUENCE: MMKMMKKMMMMMMM
TOTAL COURSE: 92
TOTAL WALES: 56
NORMINAL DIAMETER OF EACH YARN:
COURSES PER INCH(CPI): 46
WALES PER INCH(WPI): 28

DRAG & DROP FILE
OR
CLICK HERE TO ADD FILE

FILE FORMAT SHOULD BE IN PNG

1402

©2021 BLACK SWAN TEXTILE, LLC

FIG. 14C

SYSTEMS AND METHOD FOR TEXTILE FABRIC CONSTRUCTION

The present application claims priority to U.S. Provisional Application No. 63/112,814, entitled "Fabric Information System and Methods of Use" filed on Nov. 12, 2020; the content of which are hereby incorporated by reference in its entirety.

FIELD OF THE DISCLOSURE

The present disclosure relates generally to computer analysis and construction of fabrics. More specifically, the present disclosure relates to image recognition and artificial intelligence for determining and recognizing fabric construction and methods for constructing fabrics stored in an electronic database.

BACKGROUND

Clothing designers and manufacturers typically rely on fabric samples of materials in order to make product selections. For example, clothing designers may be presented with and inspired by a particular fabric for use in creating a garment. However, it is often difficult for the designer to collaborate with others when samples are not readily available to the designer and the other collaborators.

In a typical design environment, actual physical samples of materials are held in sample books or a library. When a particular sample is needed, the sample is identified and samples are physically circulated for discussion. This makes it difficult for designers at separate locations to work collaboratively, particularly with those who may be at remote locations.

Further, while textile manufacturers may provide basic information such as the color, pattern, and elements used to create a material, this information often lacks the specificity that a designer may need in the future to produce the fabric. Since each manufacturer may also not adhere to the same nomenclature as other manufacturers to describe attributes of their materials, it is difficult for the designer to view, choose, and understand how different materials may look together or how they would work for a final product by using the manufacturer-provided descriptions alone. For example, manufacturers may classify or describe particular patterns or construction techniques differently. Thus, two descriptions of the same fabric style may be different.

SUMMARY

As disclosed herein, systems and methods are provided that enable an image to be captured from a fabric sample. The image is analyzed to extract features about the threads or yarn used in the fabric and the particular stitch type, weave, or knit of the fabric. These features can be collected to define a fabric using what is referred to as a "stitch parameter." A build specification can be produced using the stitch parameters. In various embodiments, the system can use images of the material and find one or more close matches of a build specification selected from a plurality of build specifications using artificial intelligence. New materials and fabrics can be analyzed and stored as a collection of build specifications to grow a database of a multiplicity of fabrics. Each of the plurality of build specifications is associated with at least one of a plurality of known fabric constructions. In various applications of the present subject matter, the system can be used to generate a build specification from image recognition of the particular fabric. That build specification and its stitch parameters may be electronically transferred to another location where it can be used by designers in electronic representations of a fabric article and may be used to remotely and construct a fabric similar to the original, imaged fabric.

In various embodiments of the present subject matter, a person or business may collect a plurality of build specifications to create a library of fabrics. In various applications, clothing manufacturers can create and grow a database of fabrics to have a digital collection of all fabrics on-site or at all sites. The present subject matter allows for such collections to grow over time, so as to make sure that methods and practices of constructing fabrics are saved in a library for future use by the company and are readily and electronically transferable as desired by the manufacturer.

Those of skill in the art upon reading and understanding the teachings provided herein will appreciate that several other uses of a digital collection of build specifications can be used for a number of additional applications.

BRIEF DESCRIPTION OF THE FIGURES

In the drawings, which are not necessarily drawn to scale, like numerals can describe similar components in different views. Like numerals having different letter suffixes can represent different instances of similar components. The drawings illustrate generally, by way of example, but not by way of limitation, various embodiments discussed in the present document.

FIG. 11 shows a master sheet consistent with at least one embodiment of this disclosure.

FIG. 13 shows a meta sheet consistent with at least one embodiment of this disclosure.

FIGS. 14A, 14B, and 14C show a graphical user interface consistent with at least one embodiment of this disclosure.

Corresponding reference characters indicate corresponding parts throughout the several views. The exemplifications set out herein illustrate exemplary embodiments of the disclosure, and such exemplifications are not to be construed as limiting the scope of the disclosure any manner.

DETAILED DESCRIPTION

Figure 1:
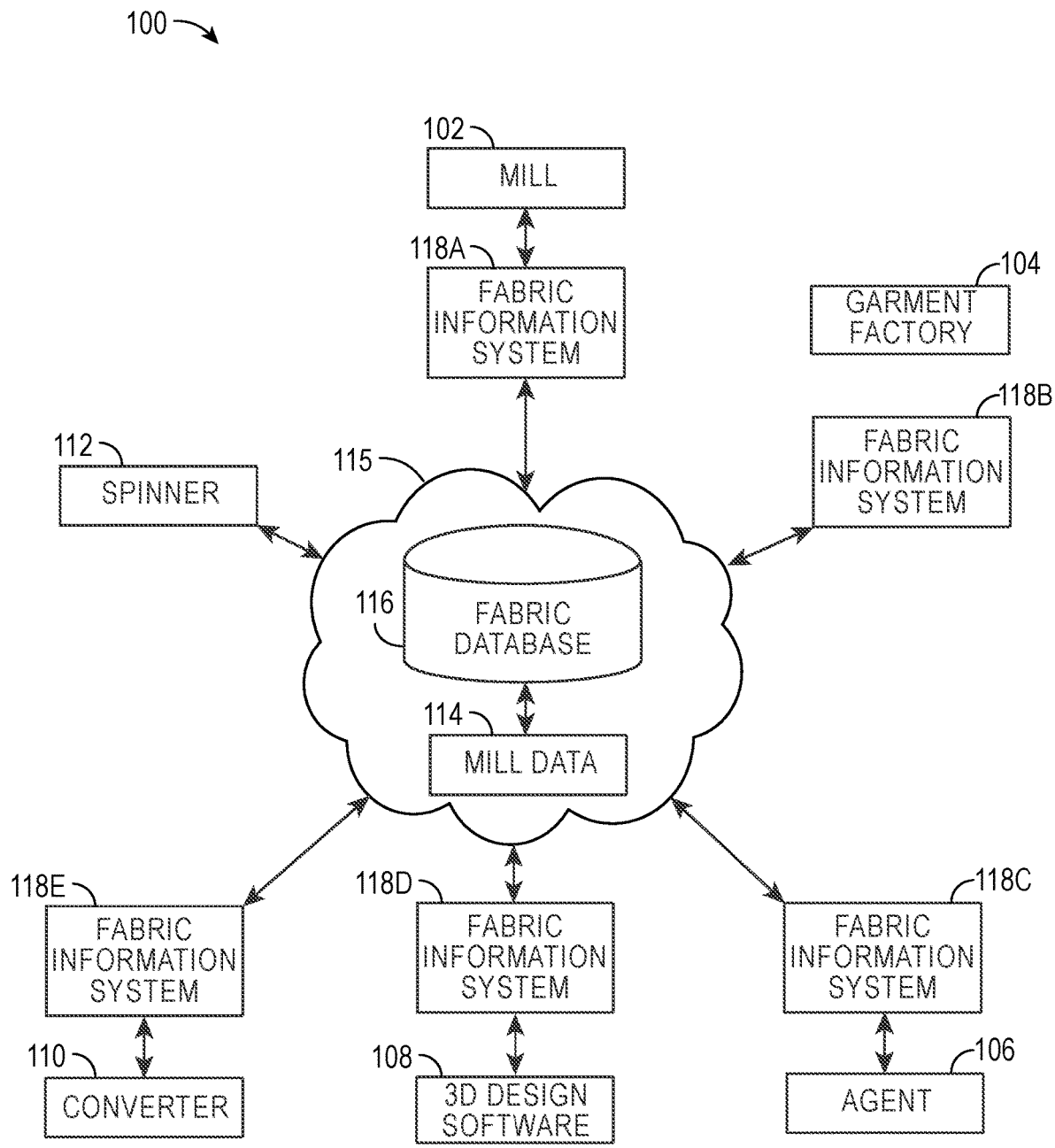
FIG. 1 shows an example textile environment consistent with at least one embodiment of this disclosure.

As disclosed herein, fabrics may be analyzed to determine their construction. More specifically, fabrics samples may be digitized and decoded to determine parameters with which to set a knitting machine to reconstruct the fabrics. In other words, the analysis reveals details of fabric construction and other mechanical attributes and/or comparisons to existing fabric samples having known construction or performance parameters. The details of fabric construction may allow for fabric mills or fabric converters to replicate desired fabrics quickly to meet customer needs and increased sales. Thus, the systems and methods disclosed herein may allow for the generation of accurate and useful fabric data that may be disseminated a variety of platforms. Stated another way, the systems and method disclosed herein may allow for the generation of machine settings for a variety of fabric knitting machines using a single input.

As disclosed herein, digital image processing technology may be used in the evaluation of fabric parameters to allow for the extraction of the fabric parameters for use in automated fabric production. One aspect of the present disclosure uses digital image acquisition hardware to obtain detailed images of the fabric. Digital image processing methods may then be used to realize the real-time physical attributes of the sampled fabric.

Consistent with at least one example disclosed herein, an optical-based fabric decoding system may be used to extract fabric construction specifications using optical, digital, and/or other automated inspection technologies. In one example, the systems and methods disclosed herein may digitize specific fabric attributes, which may include, but are not limited to, appearance, hand, drape, performance, construction, and manufacturing feasibility. The systems and methods disclosed herein may digitalize fabric data to create processes and applications to better identify, manage, and leverage fabric assets.

As disclosed herein, fabric development remains a tedious and expensive endeavor. Fabric mills often spend a great deal of time and money developing fabrics for sale to apparel brands. One path for fabric development requires mills (or suppliers) to show a wide range of fabrics at "fabric fairs" sponsored either by apparel brands or regional trade shows. Considerable mill development time, travel, and countless suitcases of "fabric inspirations" are required to meet this constant demand for "newness." With little or no direction from the brands, fabric fairs usually deliver a low adoption rate.

A second path for fabric development involves responding to requests from brands to develop fabrics based on inspirational samples. Generally, the request is for something like the sample provided by a potential customer—but always with a key difference (related to cost or one of the fabric attributes) that is difficult to achieve. Brands may initiate the same development with several mills to increase the chances of getting a fabric approved before the calendar deadline.

As mills and apparel brands adopt digitizing their fabrics using the systems and methods disclosed herein, each may be able to construct digital libraries of fabric data, such as a cloud-based searchable repository of fabric characteristics and construction specifications.

To replace the first development path, mills may upload their digitized fabric library making it accessible by apparel brands seeking fabrics. This strategy converts the mill liabilities associated with general fabric research and development (R&D) to an online menu asset that can generate fabric orders. An apparel brand user can search the mill's digital fabric assets by any number of fabric attributes to find fabric candidates that are suitable for use in garments under development. For example, an apparel brand user can search the mill's digital fabric assets using the digital build specification defined herein along with any other fabric attributes. In addition to initiating requests in a second development path, apparel brands may digitize their inspirational samples and search a database for production-ready fabrics that meet the digital build specification and/or other pre-defined requirements from member mills. Based on the sophistication of the apparel brand product design tools, the brand user can either request a fabric header card or download the fabric digital file (e.g., the complete model, not just an image file) for consideration.

As an alternate to initiating requests in the second development path, apparel brands may digitize their inspirational samples and search a database for production-ready fabrics that meet pre-defined requirements from member mills. Thus, rather than initiating a new development, the designer may review existing mill fabrics that meet the desired requirements. If no suitable fabrics are found, the fabric data file may be sent to the preferred mill as a manufacturing-ready standard. The unique digital fabric standard may provide mills with the specific information needed to replicate unidentified inspiration swatches.

Selecting fabrics from digitized database of fabrics may diminish risks for both the apparel brands and mills. Selecting known fabrics with a production history may be better than developing new fabrics with no historical data on runnability or quality. With this insight into known fabrics, the ability to adopt the right fabrics is not constrained by time or the size of an apparel brand fabric development team.

Consistent with at least one example of this disclosure, the systems and methods disclosed herein may provide fabric construction information to a mill with the detailed technical means to manufacture the fabric. The construction attribute information objectively specifies the yarns, machine settings, and finishing parameters required to make the fabric. In this manner, the mill can proceed straight to production with a new fabric as if it were an existing mill article with a production history, bypassing the conventional development process.

The above discussion is intended to provide an overview of subject matter of the present patent application. It is not intended to provide an exclusive or exhaustive explanation of the invention. The description below is included to provide further information about the present patent application.

Turning now to the figures, FIG. 1 shows an example schematic of a textile environment 100 consistent with at least one embodiment of this disclosure. Textile environment 100 may include a textile mill 102, a garment factory 104, a textile sales agent 106, design software producers 108, textile converters 110, and spinners 112. In this example, each entity may access centralized mill data 114, such as contained in a cloud-based repository 115 of textile data. Consistent with examples disclosed herein, mill data 114 may be stored in a fabric database 116 as described in greater detail herein.

Embodiments disclosed herein may also include fabric information systems 118 (labeled individually as fabric information systems 118A, 118B, 118C, 118D, and 118E), which may be accessed, for example, by mills 102, garment factories 104, agents 106, design software producers 108, and textile converters 110. As disclosed herein, fabric information systems 118 may digitize attributes of a textile material sample, thus creating a model suitable for both design and manufacturing end-users. These attributes may include, but are not limited to, appearance, hand, drape, performance, construction, and manufacturing feasibility.

The appearance of the fabric may be important to garment designers and purchasers because it is a simple way to classify different fabrics. However, objectively identifying different fabrics has been a challenge in the industry. Typically, brands assign marketing names to fabrics. These names may be unique to each brand and rarely bear any relationship to fabric types or manufacturing processes. Some basic fabric classifications like "knit" and "woven" may be used, but these generic terms may be inadequate to differentiate the multitude of fabric variations in the marketplace. Several attempts have been made to use a combination of manufacturing and marketing terms as identifiers, but none has been successful—there are just too many variations. So, a lack of a "common language" to identify fabric presents obstacles both within the brands and across the supply chain.

The systems and methods disclosed herein, address these limitations. First, they capture a high-resolution image of both sides of the fabric. These images may capture a visual appearance of the fabric sample. Fabric information systems 118 may evaluate the images to provide data points used to associate fabric construction techniques, etc., to a master part code, a digital build specification, and/or a parent-child relationship. For example, fabrics that share the same output data may be assigned to the same master part (or digital build specification) and thus may be considered identical regardless of any assigned fabric name or mill article number.

As disclosed herein, a master part identifier may serve as a solution to objectively identify fabrics. When there is a fixed limit for all combinations of required data output, each variation may serve as a unique master part code. A logical hierarchical code (e.g., dotted decimal) may be assigned to each unique master part. Setting up this structure may serve as the basis of a standardized fabric identification vocabulary combining unique hierarchical names and numbers (such as Knit Single Knit Jersey 1.2.1.10) that can be adopted as an industry standard. All marketing names and alternate fabric IDs may be associated with the master part ID as cross-references.

With a proper naming convention, such as based on a digital build specification, combined with organized data, the systems and methods disclosed herein may allow for searching of a database of fabrics. Rather than using a complex image recognition algorithm that compares an image of a fabric to images of other fabrics individually, a multi-attribute search may be initiated that first identifies a master part and then displays all the actual fabrics associated with it (e.g., all the children of the parent record). Such a search may be widened to show similar constructions, as well. Conveniently, all related fabrics may be identified and located in a database via a search function.

Fabric developers and designers acknowledge that hand is an important fabric attribute. Yet, determining or communicating information related to hand is extremely confusing since no objective method or vocabulary exists to support a development/assessment process. While many attempts have been made to model hand, there is no industry-accepted, commercially viable process to objectively characterize hand—largely because it is not understood. Fabric information systems 118 may digitize a fabric sample and the resulting data may be used to assign hand ratings to individual fabrics. The hand rating may be saved as part of the digital build specification to allow an additional input by a user to search fabric database 116. Thus, the systems and methods disclosed herein may allow for multiple different hand analysis schemes to be used. Fabric data 116 may include a database of digital fabrics that can be searched to find fabrics with similar hand ratings to a given sample or hand value.

Fabric developers and designers recognize that fabrics drape in given ways—especially based on the weight and grain—when incorporated into garments and placed over the body. A fabric's draping behavior may play a key role in the aesthetic appearance of a finished garment especially when multiple fabrics are combined in the same product. Three-dimensional apparel design software providers have attempted to digitize and model drape to drive their garment simulation capability, producing "physics files" for their software. However, there are several problems with the current methodologies that are addressed by the systems and methods disclosed herein. One problem involves time and cost. Typical 3D software providers support a process to test fabrics or enter test results for fabrics to create material-specific physics files. The testing process is time-consuming and expensive. Many apparel brands have fabric libraries in excess of 1,000 fabrics, so the cost and time of drape digitization presents a barrier to starting the 3D design process. As a way of avoiding this cost, brands have asked mills to take on the cost and time required for drape digitization. Most mills have refused since they see no value in taking on this task.

The second problem involves inaccuracy. Current 3D software providers include a library of generic digital fabrics with associated physics properties. This allows the user to design garments without incurring the burden of manual digitization. With that convenience comes inaccuracy. Selecting a generic fabric is strictly guesswork since there is no way provided to determine the closest generic match to a specific fabric. The software packages also allow the user to change the values associated with the physics file for a given fabric (both for fabrics that were actually digitized and for generic versions from the library). Adjusting these numbers often relies on guesswork. Designers adjust physics values to improve the aesthetic of the virtual design, not to improve the correlation of the virtual fabric to the actual fabric. So, the behavior of the virtual garment design loses correlation to that of a physical counterpart. This ultimately leads to supply chain problems when production garments do not look like the original 3D designs.

The third problem is the lack of standardization. Although many models are based on KES (the Kawabata Evaluation System), each software provider adds (or excludes) specific tests and applies hidden proprietary code in their program that changes how the test results model fabric behavior in 3D. So, if a brand wants to use multiple 3D design systems, they must re-digitize each fabric for each additional system, thus multiplying the time and cost of digitizing drape.

The fourth problem is a lack of correlation with physical samples. Since each 3D software provider models drape differently, it follows that the same garment rendered in each solution would look different from the others—and from the physical sample that it was intended to represent. It remains to be seen if any 3D software can render drape uniformly and repeatably.

Fabric information systems 118 may evaluate drape using existing drape models as well and those under development. Once a method has been identified, then a large collection of fabrics with known constructions and finishes may be digitized. The resulting data may be used in a machine learning project to construct an algorithm to predict the physics of fabrics digitized using the fabric information systems 118 based on their construction attributes. Thus, fabric information systems 118 may generate a predictive drape file that can be used in conjunction with 3D design programs. For example, the predictive drape file may be a component of the digital build specification and used as an additional input by a user to search fabric database 116. Additionally, a user could search fabric database 116 for drape matches to a given sample or set of drape values by searching for build specification that result in a given drape based on the predictive drape file.

Characterizing fabric performance is a mature process utilizing standardized test methods from groups like the American Association of Textile Chemists and Colorists (AATCC) and the American Society for Testing and Materials (ASTM) to rate specific performance attributes such as stretch/recovery and burst strength. The conventional wisdom in the industry is to test a fabric to an end-use protocol for which a garment incorporating the fabric is intended. This approach limits a fabric to the end-use for which it was developed rather than identifying all end-uses for which the fabric might be suitable.

Within the model, end-use may be defined as the aggregation of performance factors that satisfy a wearer's needs in a given activity or situation. Activity-specific end-uses may be comprised of product features that allow a person to perform an activity within the requirements of the task at hand. These might be sports-related or work-related. Situation-specific end-uses require product features deemed desirable for some aspect of comfort. There is, of course, crossover between activity-specific and situation-specific end-uses. Situation-specific end-uses may be driven largely by the three sensory-related fabric attributes (e.g., appearance, hand, and drape) while activity-specific end-uses are driven by fabric attributes that define the underlying properties (e.g., performance, construction, and feasibility).

Performance factors determine a fabric's suitability to meet a wearer's particular need. These factors may be related to fabric features and functions and are associated with standardized tests. Given there is a population of all wearers' needs for each end-use and a corresponding population of all performance factors, there may be some sample or subset of performance factors that establish the minimum requirements for a particular wearer's need in that activity or situation. One factor to understanding when this overlap has occurred may be a mapping of all performance factors to at least one standardized test. Test results may objectively confirm the presence or absence of a factor and, if present, to what extent.

Overall product performance may be the aggregation of many performance factors acting in concert to meet an end-use. To optimize desired performance, tradeoffs may be required. For example, if warmth is achieved with a heavier fabric and light weight is a desired outcome, some conventional components and constructions may not be options for the envisioned product. To establish an end-use profile, performance factors may be identified, defined, and associated with at least one verification test.

Once established, an end-use testing protocol, that is, a specific solution set of performance factors and associated test methods, may be assigned to each end-use. Because each performance factor may be associated with at least one verification test, end-use certification may be achieved when product test results are acceptable for each verification test in the solution set. End-use certification may provide objective and demonstrable proof that a given product delivers the desired or claimed performance and allows the maker to offer a performance guarantee with confidence.

Although the apparel industry accepts the concept of performance factors and verification testing, many brands have not identified specific end-uses and those that have rarely agree on what performance factors and test methods should be associated with each end-use. This creates a problem for designers who select fabrics based purely on aesthetic or cost factors. Later in product development, they find that the desired fabrics will not pass required performance factor testing. It also creates a particular burden on mills, who must execute or pay for extensive redundant testing of the same material for different brands.

The systems and methods disclosed herein may include performance factors and test methods usable by end-use protocols that may be specified in the digital build specification. For example for the same fabric subjected to different tests may be given different performance factors that can be saved as part of the digital build specification to allow for searching based on different testing and the results of the testing. The aggregation of results from these tests may indicate end-uses for which a particular fabric qualifies. Each qualifying end-use may be associated with a fabric so that a digital library can be queried by end-use.

Mills often conduct internal testing on fabrics regardless of brand requirements. The results are stored on internal data systems. To populate the performance data in one embodiment of fabric information systems 118, the data associated with each test in fabric information systems 118 and/or fabric database 116 may be associated with each fabric in a mill's library. Additionally, the mills may upload supplemental tests results not required to fabric database 116.

Construction requirements may include analyzing a fabric sample and deriving the information necessary to initiate the fabric manufacturing process, including raw materials identification (e.g., yarn and its subcomponents) and machine settings which can be specified in the digital build specification. The data making up those requirements may be organized in a way so that a database storing those records, such as fabric database 116, may be efficiently searched and accessed. For example, and as disclosed herein, the data making up the requirements may be stored in the digital build specification that is outputted based on search inputs extracted from an image of a fabric sample provided by the user.

Feasibility metrics supply insight into manufacturing complexity, speed, and quality—from knitting to dyeing and finishing. Garments are made of finished fabric. The machinery and processes used to manufacture any particular finished fabric may be known and thus a function of the specification, not the conditions at a competent mill. Any particular issue that creates manufacturing complexity may be common to all mills. These machinery and process variables may determine manufacturing feasibility. Some examples of feasibility issues may include, but are not limited to, knitting speed as a function of construction, defects/yard due to the complexity of the stitch structure, running errors, and finishing processes or chemistry interactions that impact the quality of the finished goods.

With those variables established—and with a continual flow of anonymized process and machinery production data associated with each fabric, the manufacturing feasibility of each fabric may be established and constantly updated. Since each fabric may be associated to a master part, specific feasibility-related data may be assigned at the master part level and is thus mill-independent.

Figure 2:
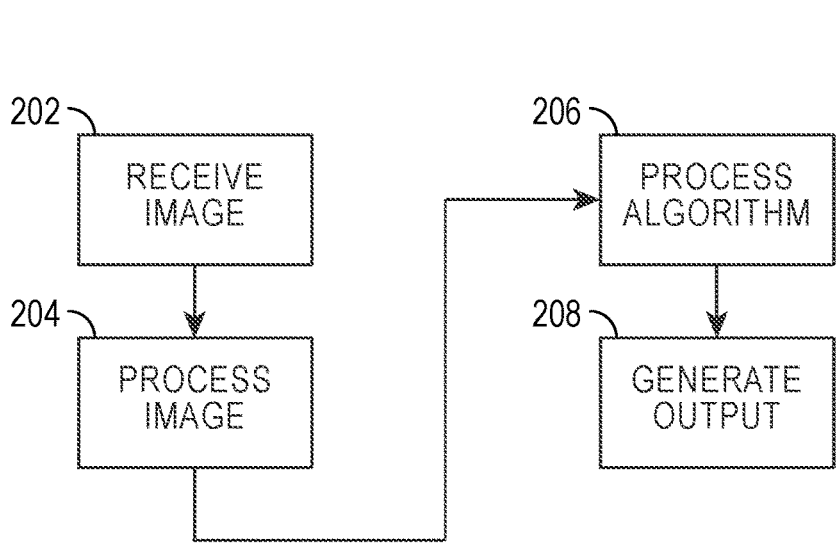
FIG. 2 shows a method consistent with at least one embodiment of this disclosure.

FIG. 2 shows an example method 200 consistent with at least one embodiment of this disclosure. Method 200 may begin at stage 202 wherein an image may be received, such as by a computing device. The image may be captured using a camera, scanner, or other image capturing techniques. In one example, a flatbed scanner may be used to provide sufficient image quality. Other examples may use other devices, such as smart phones as image capture devices.

The image may be of a front and back of a fabric sample. The image may be of an actual fabric or a simulated image that simulates the appearance of a modeled fabric. Each image may be processed in one or more ways (204) to clarify aspects of the fabric analysis. For instance, yarn "hairiness" might need to be evaluated in detail to help identify the yarn specification but eliminated to determine the stitch type and sequence. Raw image data may be preserved to support multiple analyses as disclosed herein.

Once the captured image data is processed, the image may define some of the machine set-up information. That information, along with other data, may be used as variables in mathematical formulae to determine various calculated fields as disclosed herein.

As disclosed herein, a large volume of images may be processed to build the set-up algorithm (206). In one example, data collection may combine scanning fabrics of known constructions created using high-resolution fabric simulations fabric design software. Fabric simulation may provide the ability to create samples of limitless constructions while providing all the required construction documentation. Additionally, fabric images with a variety of yarn texture variations and pattern irregularity (e.g., varying the "straightness" of the wales and uniformity of the stitch size) may be simulated to correlate with actual fabric scans. Fabric simulations may be included in the data gathering phase to increase the number and variety of samples with which to build the set-up algorithm.

The captured images may be used for machine learning training of set-up algorithms as disclosed herein. One approach may be to evaluate an entire image to identify and match against known patterns (e.g., a template version). Additionally, course count and wale count (CPI and WPI) may be derived. In this approach, each image, such as 2"×2" image, may represent one training sample. Since single knit structures may be made up of no more than three stitches in a limited repeat, training the set-up algorithm to focus on small sections of each image for stitch identification and stitch pattern sequence may be another method. Course count and wale count may be correlated to stitch identification. In this approach, a 2"×2" image, for example, of a typical fabric may contain thousands of stitches that can be used for training.

In one example, an initial stage of method 200 may be to analyze the captured image to determine a first level construction type. For example, the image may be analyzed to determine constructed yarn (e.g., knit, woven), bonded entangled fibers (e.g., nonwoven), or continuous substrate (e.g., skins, membranes). Based on that determination, a unique process may be followed to decode each material type.

Once the various images have been used to generate the algorithm, an output may be generated (208). For example, the model parameters, build sheets, fabric relational data, etc. may be exported as a JSON or other data structure. The data structure may then be used across multiple platforms to allow fabric identification and searching as disclosed herein.

Figure 3:
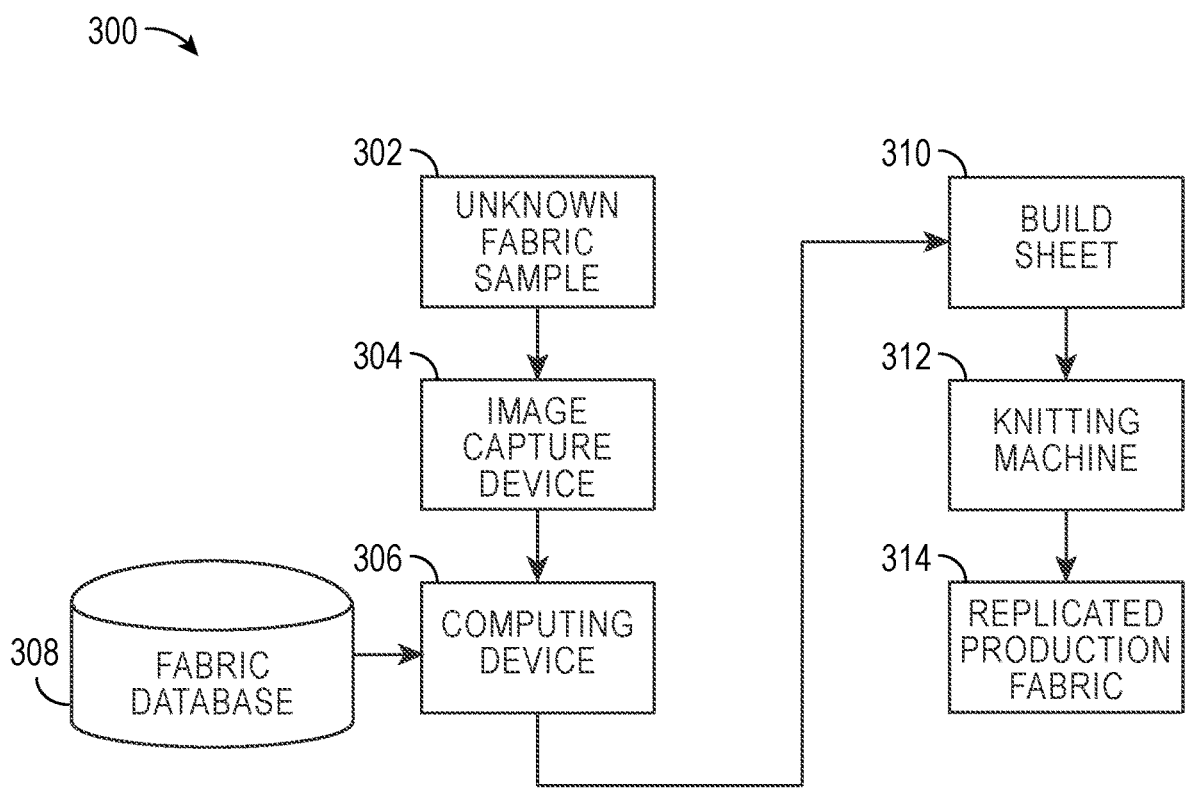
FIG. 3 shows an example system consistent with at least one embodiment of this disclosure.

FIG. 3 shows a schematic of an example process flow 300 for replicating an unknown fabric sample 302 consistent with at least one embodiment of this disclosure. As shown in FIG. 3, process flow 300 may include capturing an image of unknown fabric sample 302 using an image capturing device 304. The captured image may include both images of both the front and back of unknown fabric sample 302. As disclosed herein, the captured image may be processed via a computing device 304. Computing device 306 may process the image to extract features of unknown fabric sample 302 as disclosed herein. Using the extracted features, computing device 306 may access a database 308 to locate a build specification 310 that allows a knitting machine 312 to produce a replicated fabric 314 having the same features of that of unknown fabric sample 201.

As disclosed herein, build specification 310 may include machine set-up instructions in a JSON formatted file. Using the build specification 310 knitting machine 312 may be configured, either by autonomous control or via a knit technician, to produce replicated fabric 314. The replicated fabric may closely or exactly match the specifications of unknown fabric sample 302.

As disclosed herein, knitting machine 312 may be a circular knitting machine. In other examples disclosed herein, knitting machine 312 may include non-circular knitting and/or weaving machines.

As disclosed herein, circular knitted fabrics may include combinations of knit, tuck, and/or miss stitches. Table 1 shows examples of stitch type recognition. As shown in Table 1, a knit stitch may consist of a loop of yarn being formed by a needle. The knit stitch may be formed by the needle when a new loop of yarn is pulled through an old loop which is then cast off. A tuck stitch is a stitch producing a tuck or open effect by having a needle hold more than one loop of yarn at a time. A miss stitch is formed when the needle holds an old loop and does not receive a new yarn. It then connects two loops of the same course that are not in adjacent wales.

TABLE 1

| Type | Description Code | | Code | |
|---|---|---|---|---|
| Knit | A stitch formed by a needle when a new loop of yarn is pulled through a previously formed loop. | K<br>K<br>K | K<br>K<br>K | K<br>K<br>K |
| Tuck | A stitch formed with a tuck or open effect by having a needle hold more than one loop of yarn at a time. | K<br>K<br>K | K<br>T<br>K | K<br>K<br>K |
| Miss | A stitch formed when the needle holds a previously formed loop and does not receive new yarn and connects two loops of the same course that are not in adjacent wales. | K<br>K<br>K | K<br>M<br>K | K<br>K<br>K |

As shown in Table 1, each stitch type, may have an associated code. As a computing device is processing images of unknown fabric samples, stitch types may be identified and the appropriate code stored. For example, if the image analysis recognized a pattern when a previously formed loop does not receive new yarn and connects two loops of the same course, but not in adjacent wales, the algorithm may return a code for a miss stitch. Given that stitches may repeat in a fabric, one a miss, or any other stitch type, is identified, the algorithm may look for repeating patterns.

Figure 4:
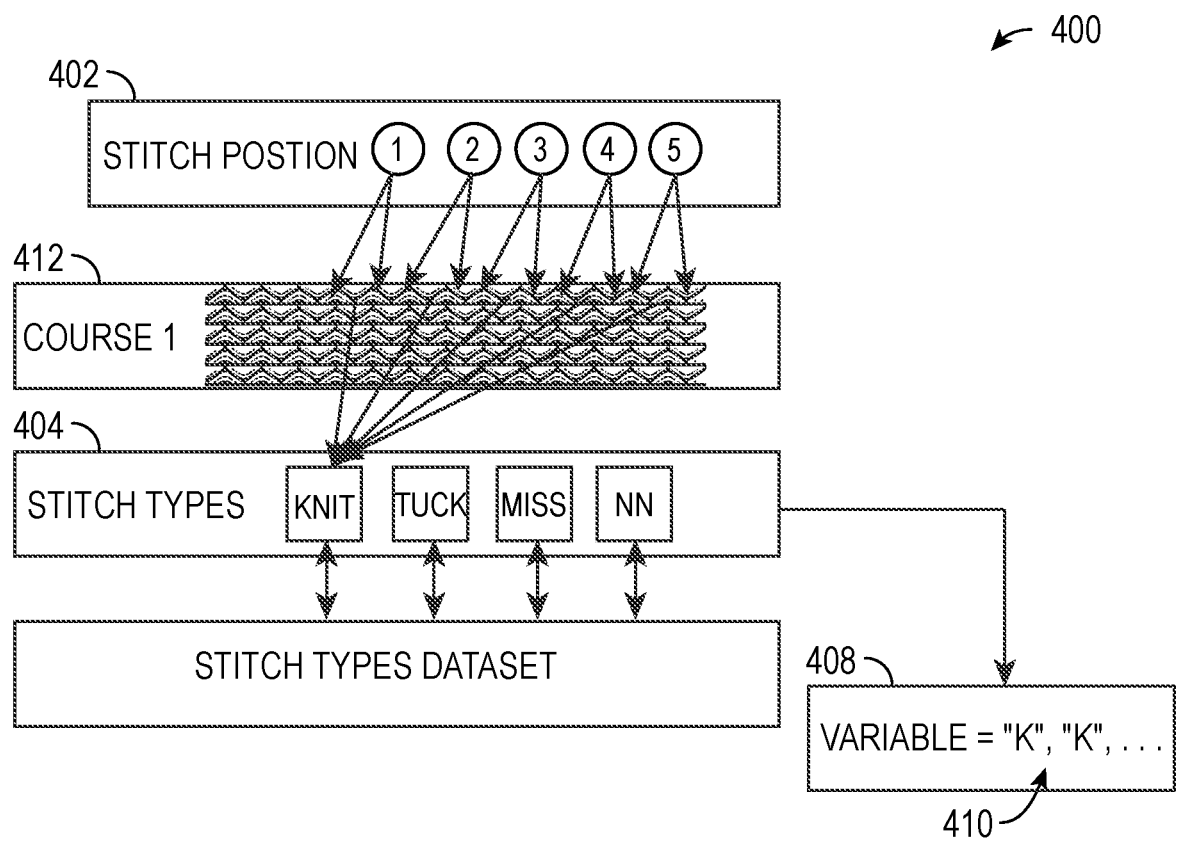
FIG. 4 shows an example process for recognizing stitch type consistent with at least one embodiment of this disclosure.

FIG. 4 shows an example process 400 for recognizing a stitch type consistent with at least one embodiment of this disclosure. As shown in FIG. 4, fabric may be divided into a number of stitch positions 402, in this example 5 stitch positions. The positions may correspond to a wale of the fabric. Each position may represent a stitch 404 that is compared to a dataset 406, such as a dataset stored in databases as disclosed herein. Once a stitch is recognized, the stitch type may be added to a variable 408 that concatenates individual stitches together into a string 410. This process is repeated for each course 412 of the image of the fabric.

Figure 5:
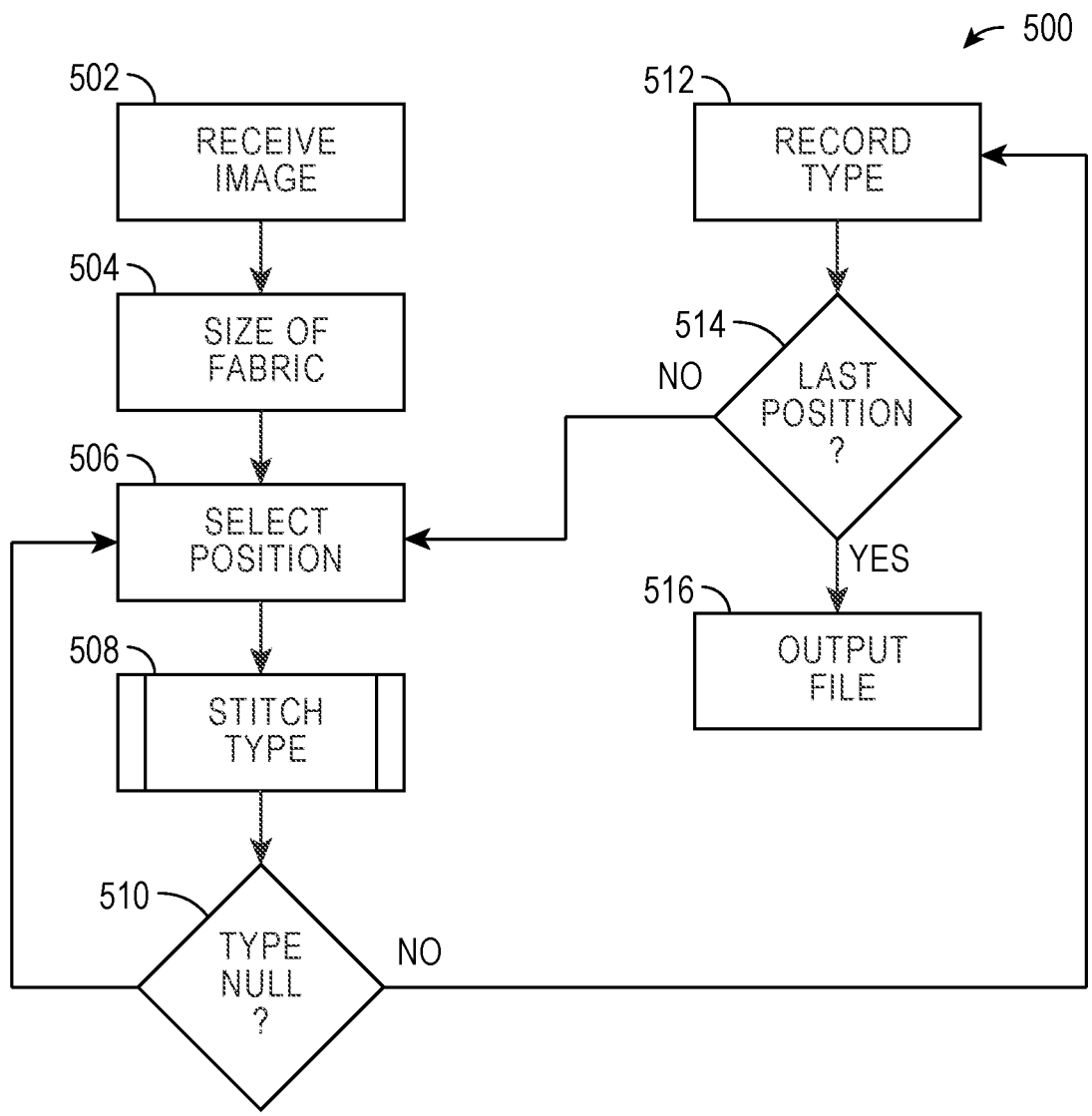
FIG. 5 shows an example method consistent with at least one embodiment of this disclosure.

FIG. 5 shows a method 500 for stitch recognition using, for example, the stitch recognition cycle of FIG. 4. Method 500 may begin with an image being received (502). As disclosed herein, a variety of image formats may be utilized, including but not limited to .png, .jpg, .gif, .tif, etc.

Once an image has been received, the physical size and/or other physical characteristics of a fabric swatch may be determined (504). For example, the fabric swatch, via the received image, may be evaluated for yarn dimensions across multiple sampling locations. Using the dimensions across multiple locations averages may be obtained to form an estimate of the swatch's physical dimensions. For example, the images may be resized so that a given pixel has a known physical dimension or images may be required to have a given resolution and be of a certain pixel count so that a pixel can be equated to a physical dimension. Other techniques such as including a reference object in the captured image that can be used to determine scale.

With the image preprocessed, the image may be analyzed to determine fabric constructions. Analyzing the image to determine fabric construction may include selecting a position in the image (506). Selecting a position may include selecting a top left position and iterating through the image in a sequential manner.

Figure 6:
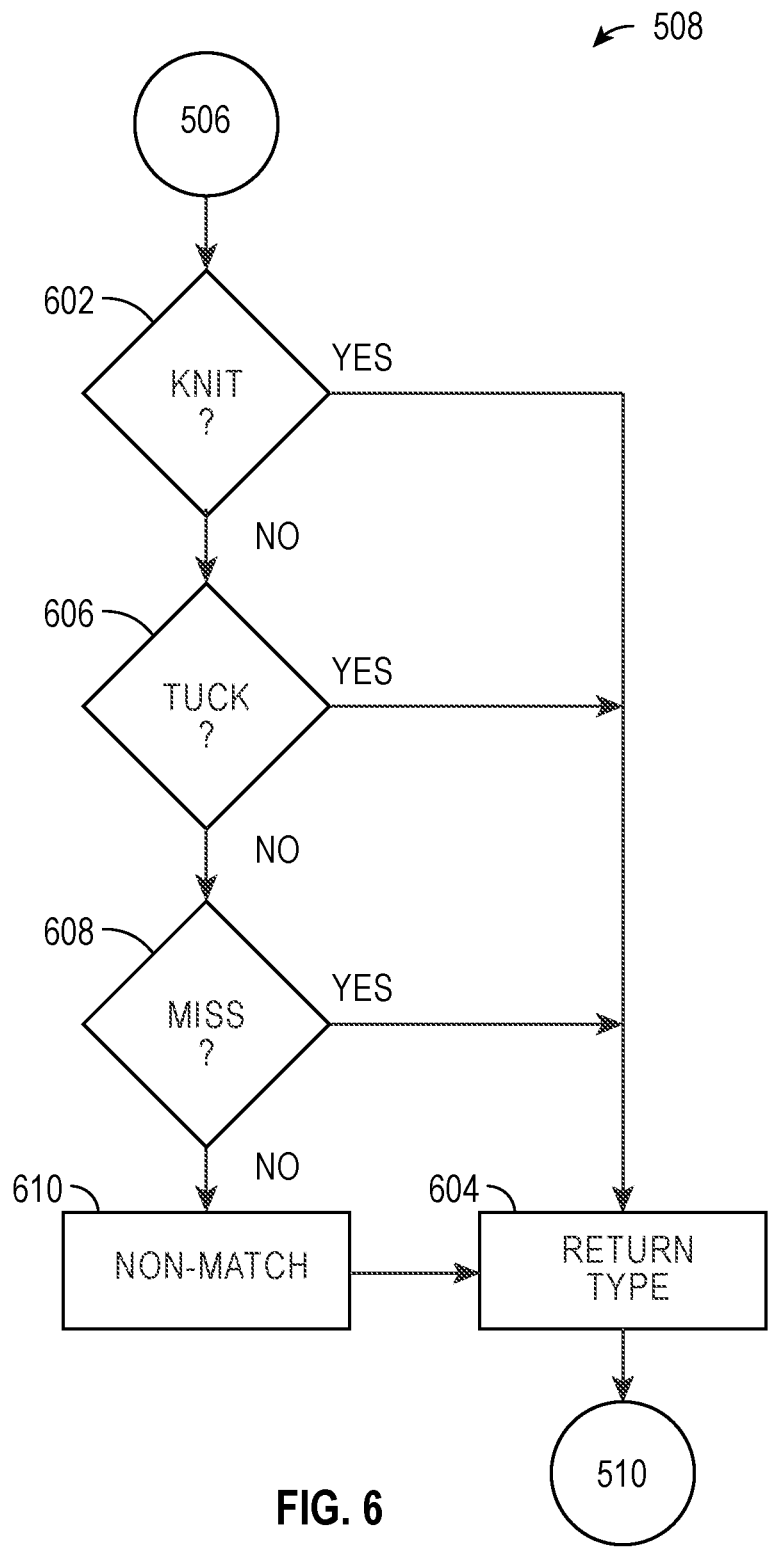
FIG. 6 shows an example method consistent with at least one embodiment of this disclosure.

Once the position has been selected, a stitch type may be determined (508). FIG. 6 shows an example method 600 for determining a stitch type consistent with at least one embodiment disclosed herein. Method 600 may include determining if the stitch at the position is a knit stitch (602). If the stitch is a knit stitch, method 600 may return the stitch type (604). If the stitch is not a knit stitch method 600 may check to see if the stitch type is a tuck stitch (606). If the stitch type is a stitch, method 600 may return the stitch type (604). If the stitch type is not a tuck stitch, method 600 may check to see if the stitch type is a miss stitch (608). If the stitch type is a stitch type, method 600 may return the stitch type (604).

Determining if the stitch type for a given position may include a process, such as that disclosed with respect to FIG. 4, or other processes. For example, portions of the received image proximate the position being analyzed may be examined to determined yarn locations and/or if one or more yarns cross each other in a known pattern associated with a knit, tuck, and/or miss stitch type.

As one example, the image, or portion of the image being analyzed may be converted to greyscale and contours of the yarns and/or fabric identified based on color values changing. In another example, a reference image of a known stitch type and similar scale may be used for an image subtraction process. During the image subtraction process, the pixel values for the known image may be subtracted from the pixel values of the received images. If the resulting value for each pixel is within a given range, then the images may be considered similar. For instance, if the reference image is of a tuck stitch and the images subtraction results in pixel values that are X of 0, then the stitch type may be set to tuck.

If after cycling through the various stitch types a match is not found, the stitch type may be set to "null" or some other value that indicates a stitch type was not found (610). The null value may be returned as the stitch type (604).

At decision block 510 a determination may be made as to if an identifiable stitch type was found. If not, method 500 may proceed to select a new position to test within the image (506). If an identifiable stitch type was found, then a code or indicator of stitch type may be stored in a variable for later used (512). For example, if the stitch type identified was a miss stitch, a "M" may be stored in a string variable. If the stitch type identified was a knit stitch, a "K" may be stored in the string variable and a "T" may be stored for tuck stiches.

Recording the stitch type may also include recording the location of the stich. For example, the image may be divided into a grid of courses and wales. For a given course and wale, which may be represented as a coordinate pair, a given stitch type.

Once the stitch type is recorded, a determination can be made as to if the last position in the image has been reached (514). If the last position has not been reached, method 500 may return to stage 506 where the next position is selected for analysis. If the last position has been reached, a file or variable containing the stitch types may be outputted (516). For example, after each position of the image is analyzed, an output file may be provided in an industry-recognized format, such as a JSON file format. In other examples, the output file may be provided in existing or newly developed file formats that is readable by knitting machines and/or used to program and/or configure knitting machines.

Part of the output file may also include other properties of the fabric. For example, since the dimension of the fabric are known, the output file may include a parameter that defines the yarn thickness. Other parameters may define the courses and wales sizes such as courses per inch (CPI) and wales per inch (WPI).

Figure 7:
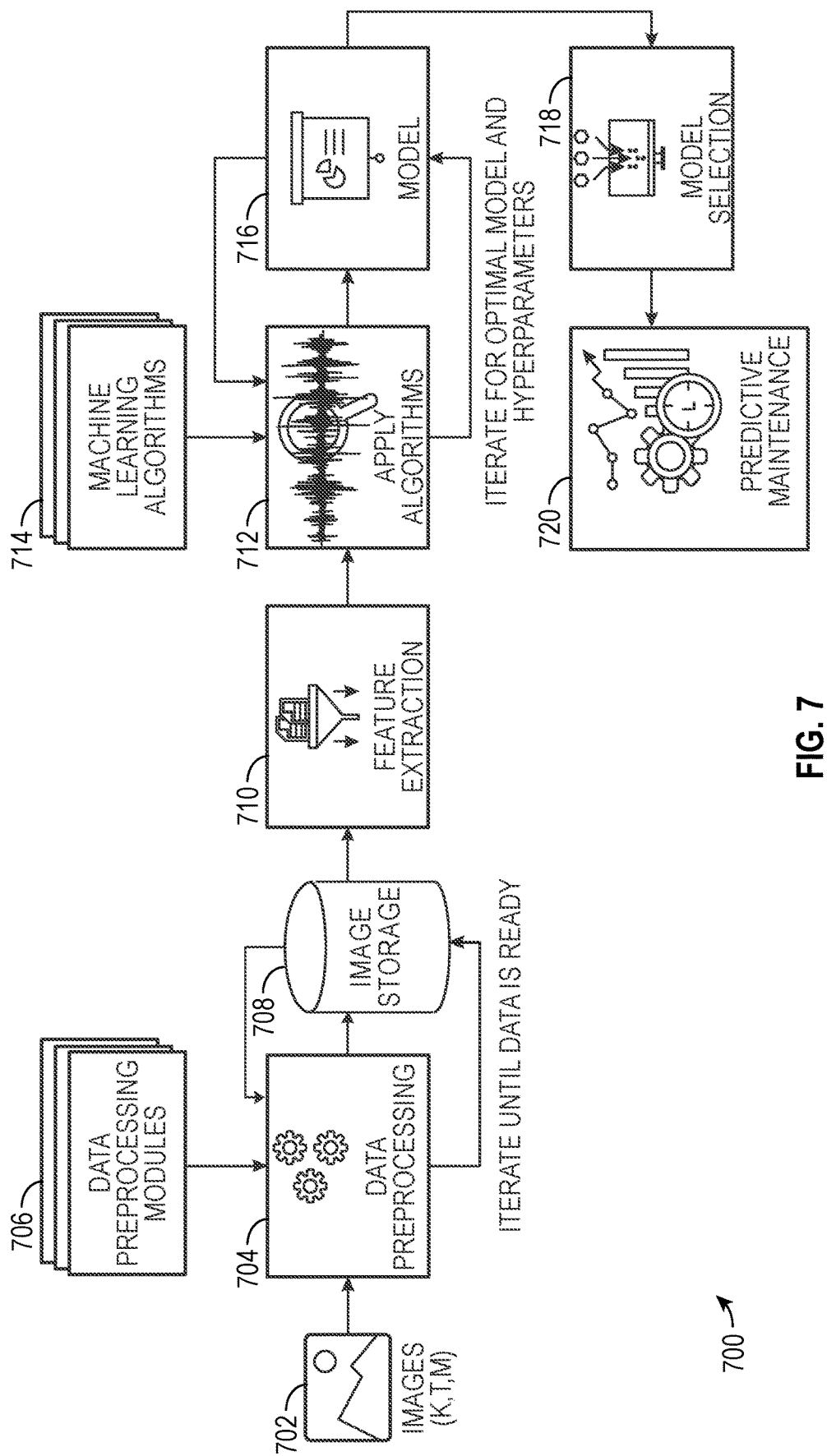
FIG. 7 shows a process flow consistent with at least one embodiment of this disclosure.

FIG. 7 shows a process flow 700 for creating and/or training a model used to determine fabric construction consistent with at least one example of this disclosure. Process flow 700 may begin by receiving a plurality of known images (702). The known images may be of physical fabric samples captured using a scanner, camera, etc. as disclosed herein. Because the images are of known fabrics, the stitch types, yarn parameters, size of the images, image resolution, etc. are known.

The images may be preprocessed (704). Preprocessing the data may include resizing images to a standard size, either in dimensions of pixels or units of length (e.g., inches). Additional preprocessing may include converting images from a first file type to a second file type. For example, tif images may be converted to png images. Other preprocessing may include color correction and/or adjustments, converting the images to greyscale, using of filters to minimize noise that may be contained in the images, etc. The data preprocessing may utilize one or more data preprocessing modules 706 to perform one or more of the preprocessing functions. Once the images are processed, they may be stored into one or more sets or subsets of images (708).

Once the images are stored, a first subset of the images may be selected to build and/or train a model and features of the image may be extracted (710). For example, as disclosed herein various image analysis methods may be employed to extract features from the image. For example, using image analysis, stitches of known type may be extracted as well as fabric parameters such as CPI, WPI, and/or yarn dimensions.

An algorithm may be applied that matches the extracted features to the known features of the fabric (712). Matching the extracted features to known features may include applying various machine learning algorithms (714). Non-limiting examples of machine learning algorithms include regression (linear and/or non-linear), logistic regression, k-nearest neighbor techniques, Naïve Bayes, random forest, etc.

Application of the various machine learning algorithms to match extracted features to known features may result in a model being produced (716). Application of the algorithms may be done in an iterative manner to arrive at the model. The model may include variables that allow for values associated with extracted features to be inputted. For example, one variable may allow for a pixel value and/or the difference between pixel values to be inputted as part of predicting a stitch type. Other parameters may include yarn dimensions, image dimensions, CPI and/or WPI values, etc. The various values may be specific values and/or ranges of values and values may be dependent on other values. For example, the yarn dimension may be specific values based off of the CPI and WPI, which may be a range of values.

As part of the model validation, a second subset of known images may be received and features extracted. Values associated with the extracted features may be inputted into the models. As part of the iterative process of determining the models, the confidence associated with each model may be determined using statistical methods. The model that shows the best statistical match may be selected (718). As new images are received from users and new determinations made, the various models generated may be updated as part of a predictive maintenance process (720).

Figure 8:
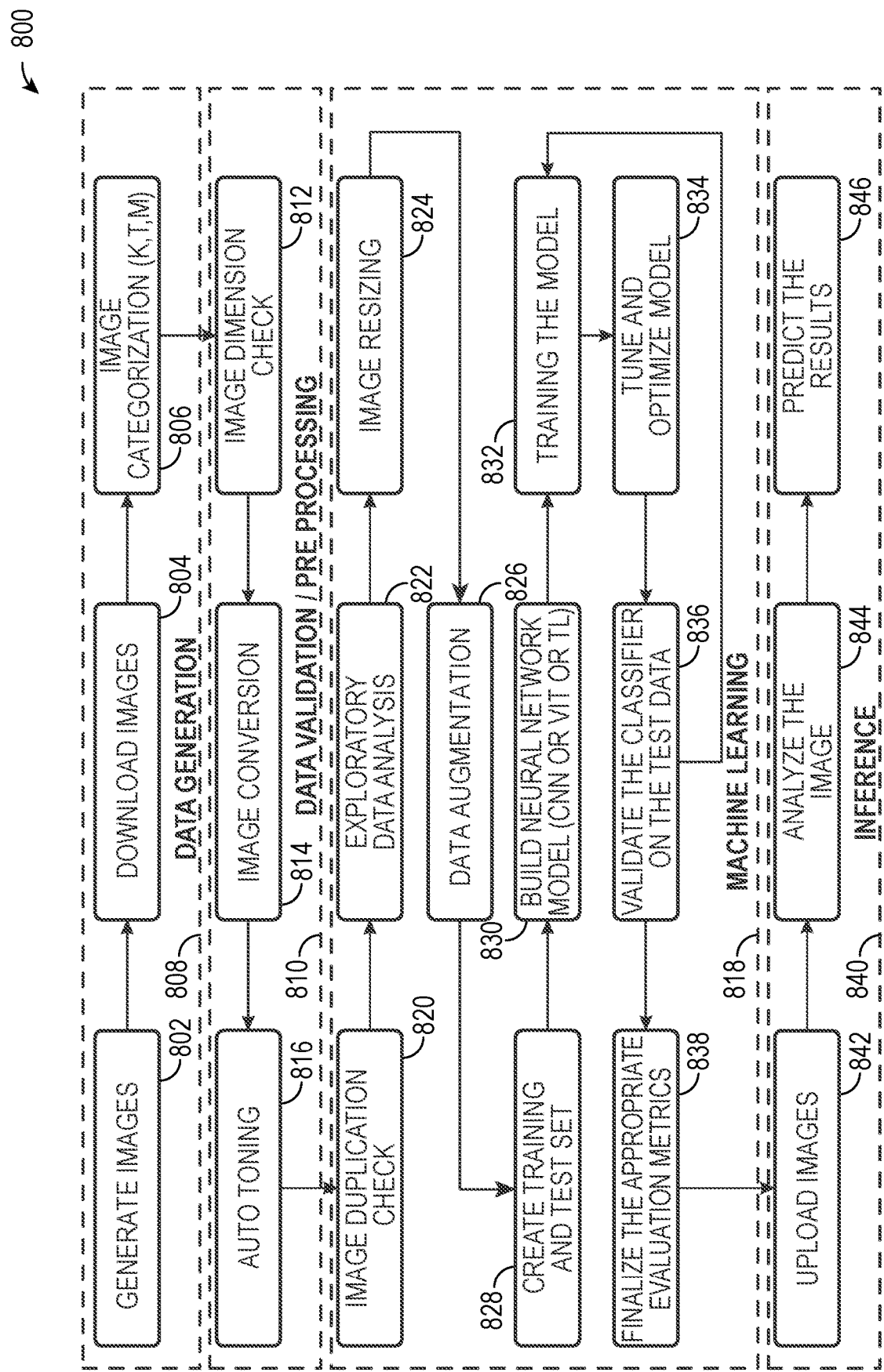
FIG. 8 shows a method consistent with at least one embodiment of this disclosure.

FIG. 8 shows a method 800 for generating a machine learning model consistent with at least one embodiment of this disclosure. For example, method 800 may be used to generate a machine learning model to predict stitch types. Method 800 may begin at stage 802 where training images may be created. As disclosed herein, the training images may be computer generated images of fabrics. The images may include lines that represent yarn placement and show how one or more threads of yarn are added together to form a fabric. The training images for single knit fabrics may include various combinations of knit, tuck, and miss stitches in a variety of patterns. The training images may include the use of yarns of different diameter, coarseness, etc. Once generated the training images may be downloaded to a training server (804). The training server may be any computing device or collection of computing devices that perform any portions of method 800.

The training server may categorize the training images (806). For example, since the characteristics of the images are known because the characteristics were used to generate the images, the images may be categorized based on their characteristics. For instance, if an image is known to include only knit stitches, the image may be categorized as "knit only." If an image contains both knit and tuck stitch types, the image may be categorized as "knit and tuck." If the image contains both knit and miss stitch types, the image may be categorized as "knit and miss." For images that contain knit, tuck, and miss stitch types, the images may be categorized as "knit, miss, and tuck."

Stages 802, 804, and 806, may be considered a data generation stage 808. Data is generated to create because it is neither practical nor necessary to first collect images from actual fabrics for use in training the machine learning model. Once the training images are generated, a data preprocessing or data validation stage 810 may be performed. Part of data preprocessing or validation may include performing an image dimension check (812). An image dimension check may include determining the image size is within a given range. The image dimension check may be performed on both generated images and captured images. For instance, after initial creation of the machine learning model, further training may be performed as scanned images of actual fabric are received.

Images may be converted from a first type to a second type (814). For example, images may be received as jpg, tiff, png, bitmap, etc. For consistency, the images may be converted to png for further analysis.

Once the images are of the same file type, image toning may be performed (816). The image toning may include converting color images to greyscale. Other examples of image toning may include color correction, the application of filters, etc. Image toning may also include filtering noise from images.

Once the training images are generated and preprocessed, machine learning may take place (818). First, duplicate images may be removed from the training images (820). Removing duplicate images from the training set may be helpful because using the same image over and over may skew results. After removing the duplicate images, an exploratory data analysis may be performed (822). The exploratory analysis may be used to identify images that that have different sizes as well as to extract general properties of the images that may be used as variables for the machine learning model. For example, metadata from the image may indicate image resolution, image size, etc. The properties of the images may be inputs to the machine learning model so that images with similar properties may be treated in a similar manner.

The machine learning process may include resizing the images (824). The images may be resized so that each of the images has the same size. By having the same size, the process of stepping through each of the courses and wales shows in an image may be simplified because a known step size may be used.

Once the training images are resized, data augmentation may be applied (826). Data augmentation may include labeling portions or the data or otherwise associating data with one or more of the training images to assist in generating and training the machine learning model.

The training images may be divided into subsets (828). For example, the initial training images may include thousands, if not tens or hundreds of thousands, of images. To generate and test the machine learning model, the plurality of images may be divided into two or more subsets. A first subset of images may be used to generate the machine learning model and a second subset of the images may be used to test and/or validate the machine learning model.

Once the images have been divided into subsets, the machine learning model may be generated (830). Different types of models, such as convolutional neural network (CNN), vision transformer (ViT), transfer learning (TL), ResNet-18, etc. may be used. A CNN maybe a convolutional neural network that is a type of artificial neural network used in image recognition and processing that is specifically designed to process pixel data. A CNN may be applied to analyze visual imagery. As an example, CNN may be used for stitch type and stitch sequence prediction.

A ViT is a vision model based as closely as possible on the transformer architecture originally designed for text-based tasks. ViT may represent an input image as a sequence of image patches and directly predict class labels for the image.

A TL may focus on storing knowledge gained while solving one problem and applying it to a different but related problem. For example, knowledge gained while learning to recognize stitch types may be used to recognize stitch sequences. ResNet-18 is a kind of convolution neural network that is 18 layers deep. A pre-trained version of the network trained on more than a million images may be loaded from a database. The pre-trained network may classify images into 1000 object categories, such as keyboard, mouse, pencil, and many animals. As used herein, ResNet-18 may be used to predict CPI and WPI.

Once the machine learning model is built, the model can be trained using the first subset of the training images (832). Training the model may include using known information about the images and the stitch features known about the images. For example, the inputs for the models may be known data from the images about the stitch type, stitch sequences, yarn dimensions, etc. Using the data techniques such as regression and others disclosed herein may be used to tune and optimize the model (834).

Once the model has been tuned and optimized, the second subset of data may be used to validate the model (836). For example, data from the second subset of images may be fed into the machine learning model as inputs and a determination made as to how well the model predicts the build for the second subset of images. The process of training, tuning, and validating the model may be repeated to improve accuracy. Once the machine learning model is trained, tuned, and validated, the parameters, sometimes call evaluation metrics, may be finalized (838).

After the model has been finalized, a user, such as knit technicians or other person wanting to analyze a fabric sample, may utilize an interface process 840 to determine the fabric sample's construction. For example, the user may upload a captured image of the fabric sample using a graphical user interface as disclosed herein (842). Once the image is uploaded, the image may be analyzed as disclosed herein (844). For example, features on the image may be extracted and analyzed as disclosed with at least respect to FIGS. 5 and 6. After analysis, the user may be presented with a predicted result (846). The predicted result may be a build sheet or other data usable to reconstruct the sample fabric by a knit technician or an autonomous knitting machine.

Figure 9:
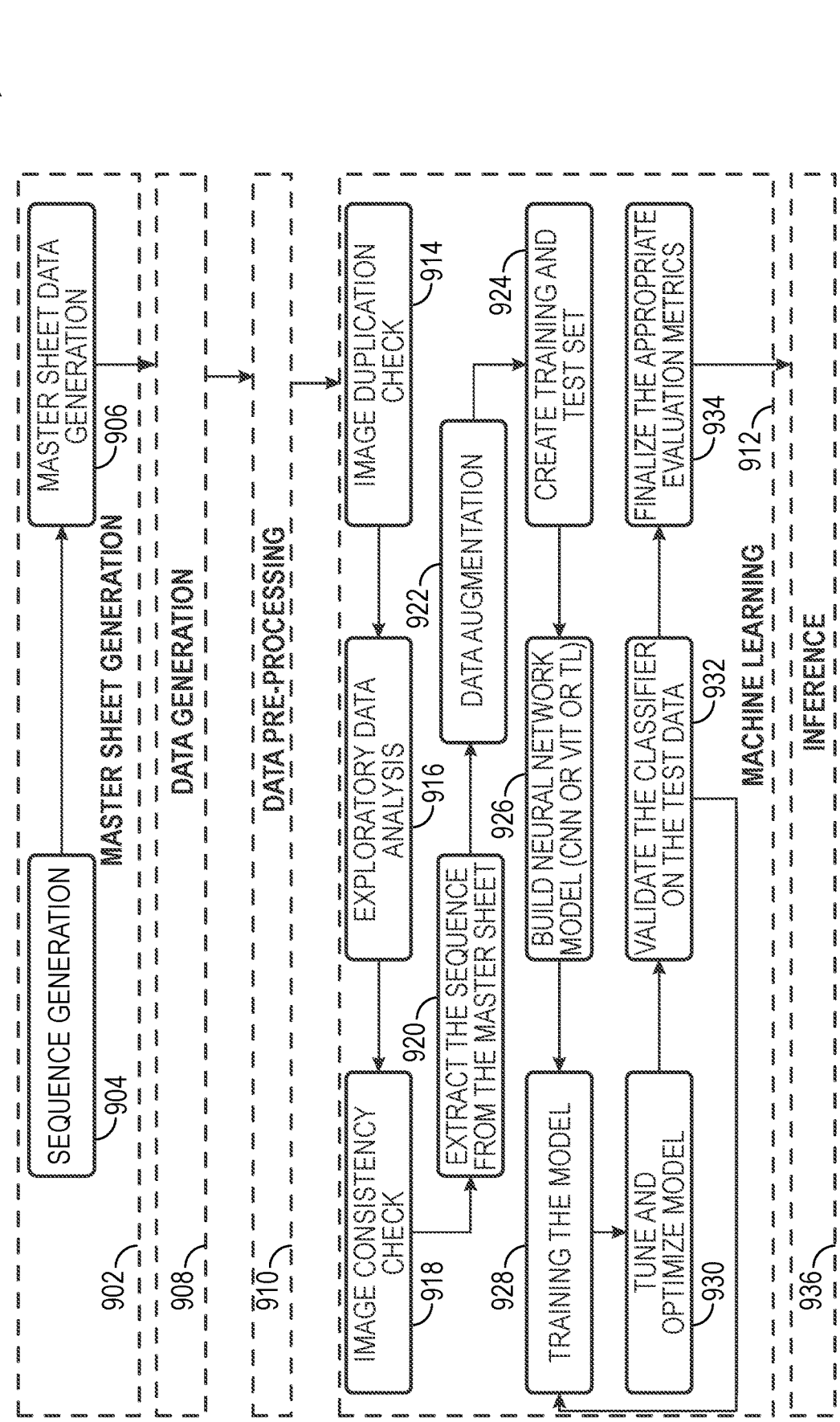
FIG. 9 shows a method consistent with at least one embodiment of this disclosure.

FIG. 9 shows a method 900 for generating a machine learning model consistent with at least one embodiment of this disclosure. For example, method 900 may be used to generate a machine learning model to predict stitch sequences. Method 900 may begin by generating a master sheet (902). Master sheet generation may begin by generating sequences of stitches (904). For example, various stitch types may be arranged in various sequences such as 2×2, 2×3, 3×2, 3×3, etc. Stated another way, the various stitch types may be arranged in a matrix of sequences with courses as the X-axis and wales as the Y-axis. FIGS. 10A, 10B, 10C, and 10D show loop maps consistent with at least one embodiment of this disclosure. The loop maps may represent stitch sequences in a matrix format.

Figure 10A:
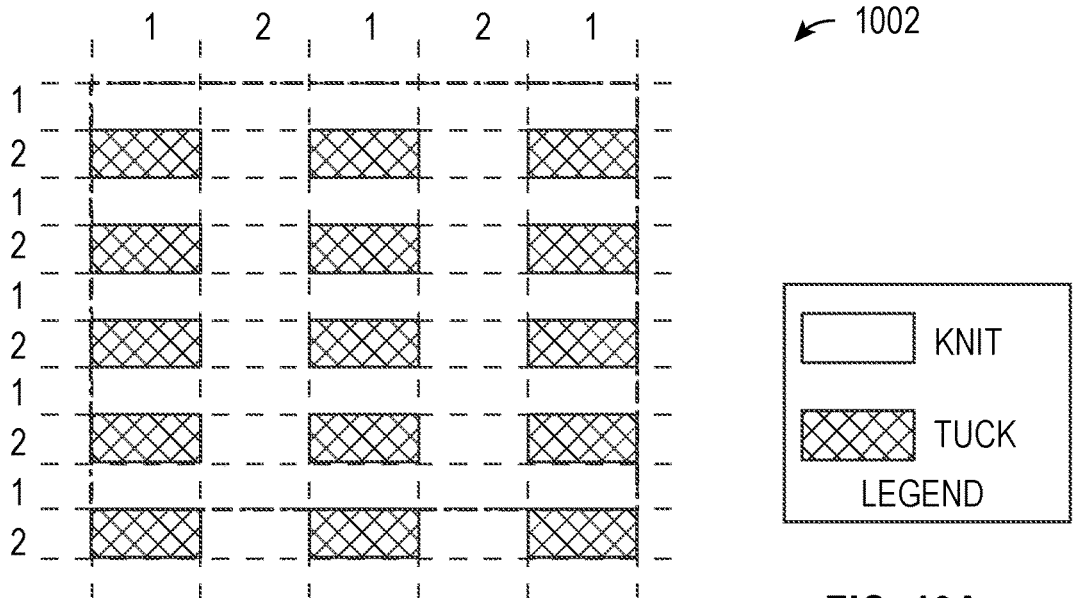
FIGS. 10A, 10B, 10C, and 10D each show a loop map consistent with at least one embodiment of this disclosure.

FIG. 10A shows a loop map 1002 consistent with at least one embodiment of this disclosure. Loop map 1002 may have a first course, 1, that includes two different types of stitches, such as knit and tuck. A second course 2, may be a single stitch type, such as knit. A first wale, 1, may include two different stitch types, such as knit and tuck, and a second wale, 2, may be a single stitch type, such as knit. As shown in FIG. 10A, course and wales may be approximately the same size and are proportionally dependent on the ratio of courses per inch (CPI and wales per inch (WPI).

Figure 10B:
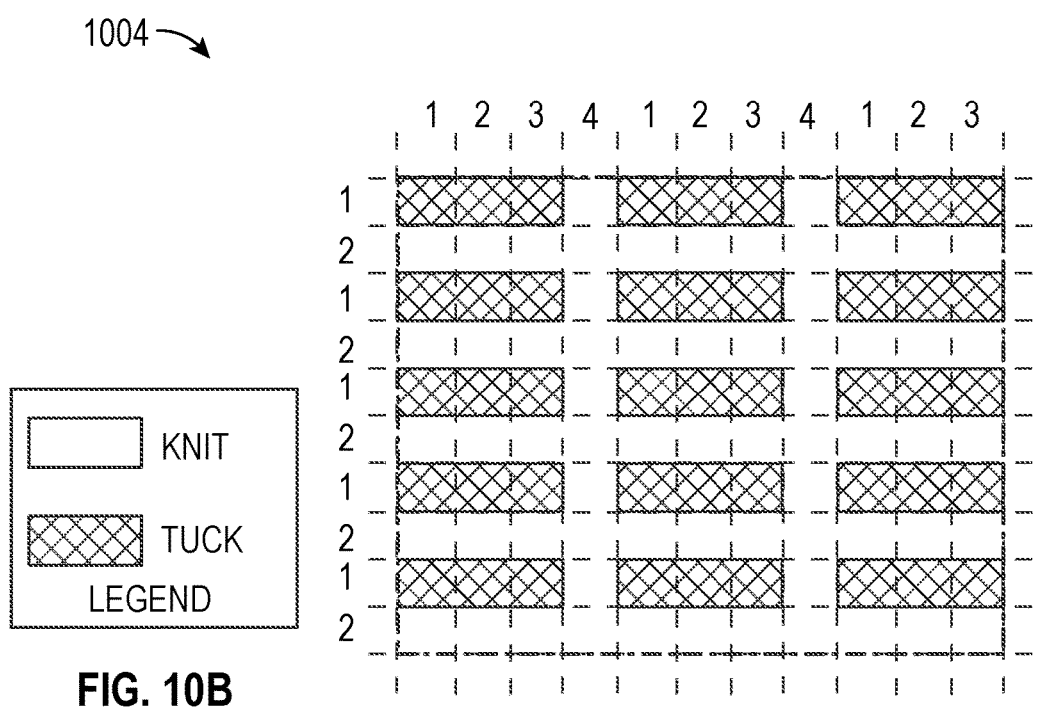

FIG. 10B shows a loop map 1004 consistent with at least one embodiment of this disclosure. Loop map 1004 may have a first course, 2, that includes two different types of stitches, such as knit and tuck. A second course 2, may be a single stitch type, such as knit. A first wale, 1, may include two different stitch types, such as knit and tuck, and a second wale, 2, may be a single stitch type, such as knit. As shown in FIG. 10B, a course may include multiples of the same stitch, such as tuck stitches, in succession that may be separated by a single stitch type, such as a knit stitch. As shown in FIG. 10B, a course may have three tuck stitches in succession that are separated by a knit stitch.

Figure 10C:
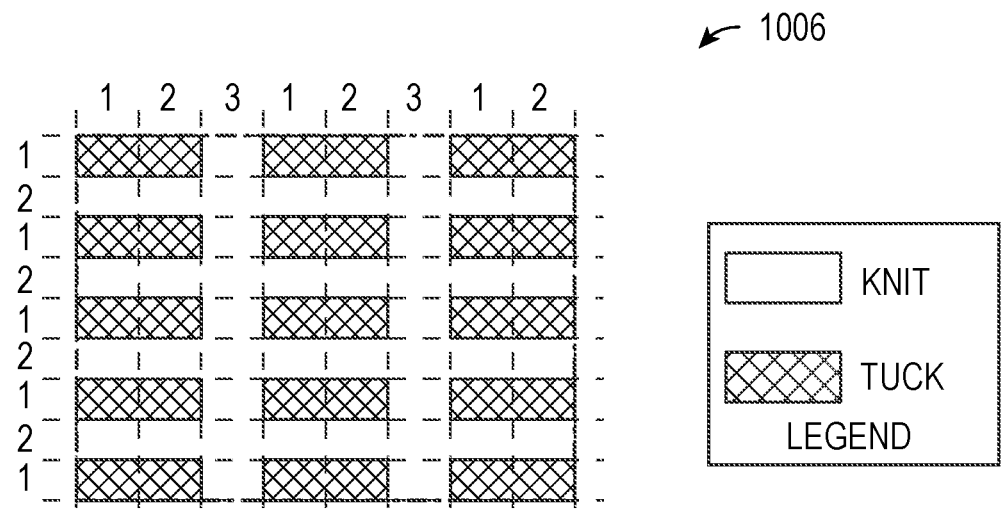

FIG. 10C shows a loop map 1006 consistent with at least one embodiment of this disclosure. Loop map 1006 may have a first course, 2, that includes two different types of stitches, such as knit and tuck. A second course 2, may be a single stitch type, such as knit. First and second wales, 1 and 2, may include two different stitch types, such as knit and tuck, and a third wale, 3, may be a single stitch type, such as knit. As shown in FIG. 10C, a course may include multiples of the same stitch, such as tuck stitches, in succession that may be separated by a single stitch type, such as a knit stitch. As shown in FIG. 10C, a course may have two tuck stitches in succession that are separated by a knit stitch.

Figure 10D:
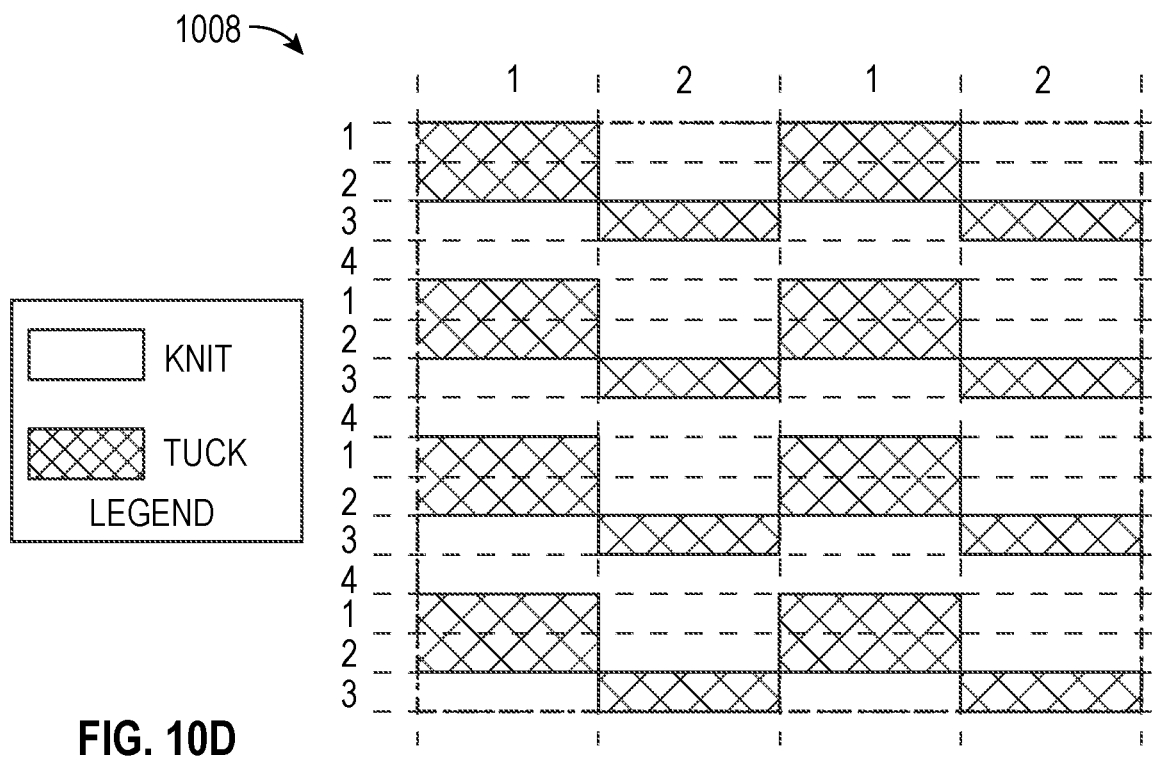

FIG. 10D shows a loop map 1008 consistent with at least one embodiment of this disclosure. Loop map 1008 may have first and second courses, 1 and 2, that includes two different types of stitches, such as tuck and knit. A third course 3 may include two different types of stiches, such as knit and tuck. A fourth course may be a single stitch type, such as a knit. A first wale, 1, may include different stitch types in succession, such as two tuck stitches and two tuck stitches. As shown in FIG. 10B, a course may include multiples of the same stitch, such as tuck stitches, in succession that may be separated by a single stitch type, such as a knit stitch. As shown in FIG. 10B, a course may have three tuck stitches in succession that are separated by a knit stitch.

Using the loop maps, master sheets may be generated for each of the various sequences (906). FIG. 11 shows an example master sheet 1100 consistent with at least one example of this disclosure. As shown in FIG. 11, master sheet 1100 may include a column 1102 of file names and multiple columns 1104 showing values for courses and wales. The values for the courses and wales may correspond to values associated with the images in a given row. For example, the values may correspond to a stitch type, pixel values, yarn diameter, or any other feature of the fabric associated with the image.

Once the sequences and master sheets are generated, images may be generated (908) as discussed above with respect to data generation stage 808. The generated data may be preprocessed (910) as discussed above with respect to data preprocessing 810.

Once the training images are generated and preprocessed, machine learning may take place (912). First, duplicate images may be removed from the training images (914). Removing duplicate images from the training set may be helpful because using the same image over and over may skew results. After removing the duplicate images, an exploratory data analysis may be performed (916). The exploratory analysis may be used to identify images that that have different sizes as well as to extract general properties of the images that may be used as variables for the machine learning model. For example, metadata from the image may indicate image resolution, image size, etc. The properties of the images may be inputs to the machine learning model so that images with similar properties may be treated in a similar manner.

The machine learning process may include performing an image consistency check (918). Testing for image consistency may include testing that images are the same size and resizing images as disclosed herein. Other consistency checks may include testing for consistent resolution, noise levels, etc. within the images.

After checking image consistency, stitch sequences for the images may be extracted from the master sheet (920) and data augmentation may be applied (922). Data augmentation may include labeling portions or the data or otherwise associating data with one or more of the training images to assist in generating and training the machine learning model. For example, one or more images may be augmented with sequence data extracted from the master sheet.

The training images may be divided into subsets (924). For example, the initial training images may include thousands, if not tens or hundreds of thousands, of images. To generate and test the machine learning model, the plurality of images may be divided into two or more subsets. A first subset of images may be used to generate the machine learning model and a second subset of the images may be used to test and/or validate the machine learning model. The subsets of images may or may not include augmentation with data from the master sheet. For example, the first subset of images may be augmented with sequence data and the second subset of images may not be augmented with sequence data.

Once the images have been divided into subsets, the machine learning model may be generated (926) as disclosed herein at least with respect to machine learning model generation 818. Once the machine learning model is built, the model can be trained using the first subset of the training images (928) as disclosed herein at least with respect to at least model training 832. Using the data techniques such as regression and others disclosed herein may be used to tune and optimize the model (930) as disclosed herein at least with respect to tuning and optimization 838.

Once the model has been tuned and optimized, the second subset of data may be used to validate the model (932). For example, data from the second subset of images may be fed into the machine learning model as inputs and a determination made as to how well the model predicts the build for the second subset of images. The process of training, tuning, and validating the model may be repeated to improve accuracy. Once the machine learning model is trained, tuned, and validated, the parameters, sometimes call evaluation metrics, may be finalized (934). After the model has been finalized, a user, such as knit technicians or other person wanting to analyze a fabric sample, may utilize an interface process 936 to determine the fabric sample's construction as disclosed with at least respect to user interface process 840.

Figure 12:
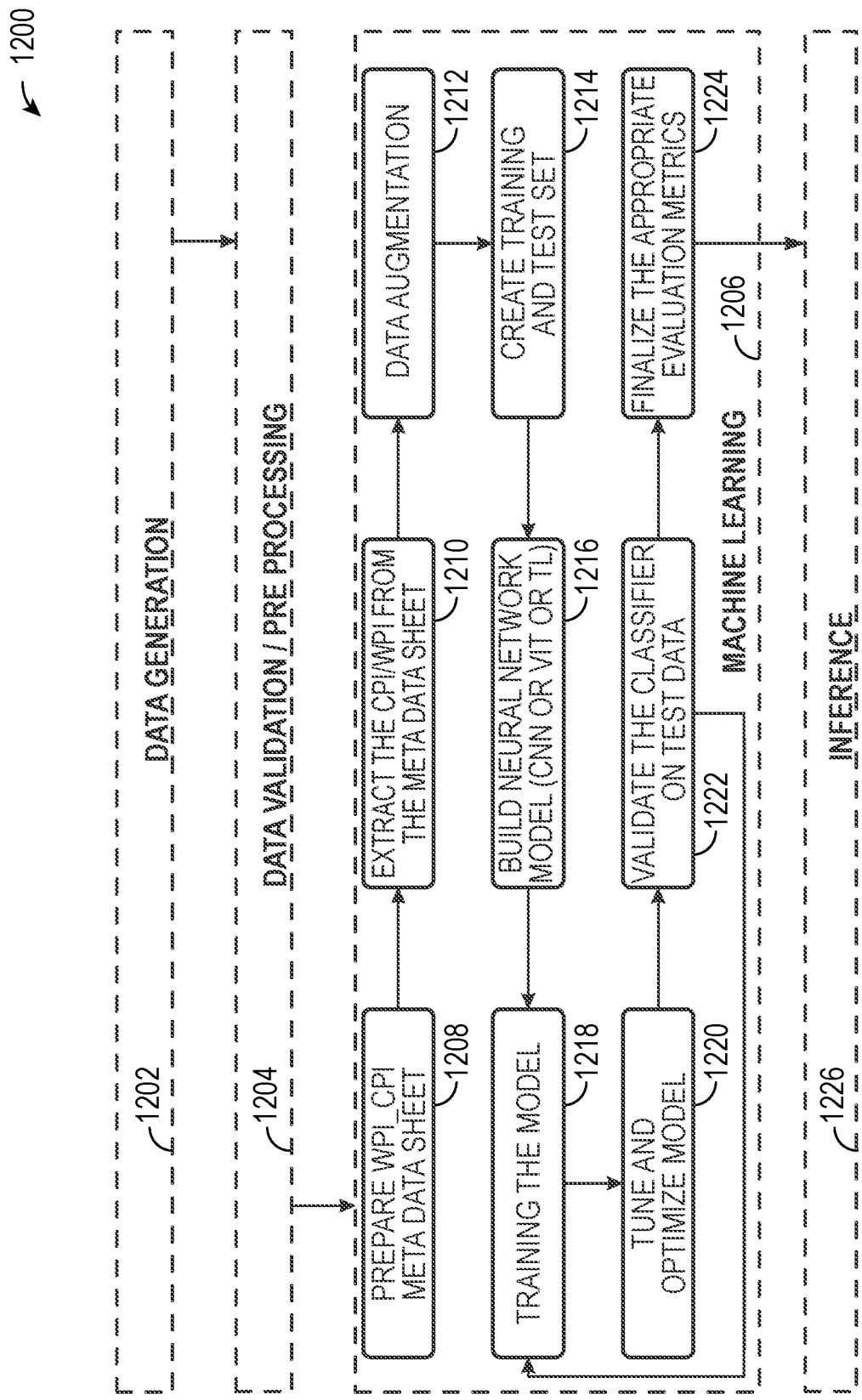
FIG. 12 shows a method consistent with at least one embodiment of this disclosure.

FIG. 12 shows a method 122 for generating a machine learning model consistent with at least one embodiment of this disclosure. For example, method 1200 may be used to generate a machine learning model to predict WPI and CPI. Method 1200 may begin by generating data (1202) as discussed above with respect to data generation stage 808. The generated data may be preprocessed (1204) as discussed above with respect to data preprocessing 810.

Once the training images are generated and preprocessed, machine learning may take place (1206). Part of the machine learning process may include preparing a metadata sheet (1208). FIG. 13 shows an example metadata sheet 1300 consistent with at least one example of this disclosure. As shown in FIG. 13, metadata sheet 1300 may include a column 1302 of file names and columns 1304 and 1306 listing the WPI and CPI, respectively, for each file. Since the images are generated, the CPI and WPI for each image is known.

The WPI and CPI data may be extracted from the metadata sheet (1210) and data augmentation may be applied (1212). Data augmentation may include labeling portions or the data or otherwise associating data with one or more of the training images to assist in generating and training the machine learning model. For example, one or more images may be augmented with known WPI and CPI data from the metadata sheet.

The training images may be divided into subsets (1214). For example, the initial training images may include thousands, if not tens or hundreds of thousands, of images. To generate and test the machine learning model, the plurality of images may be divided into two or more subsets. A first subset of images may be used to generate the machine learning model and a second subset of the images may be used to test and/or validate the machine learning model. The subsets of images may or may not include augmentation with data from the master sheet. For example, the first subset of images may be augmented with WPI and CPI data and the second subset of images may not be augmented with the data.

Once the images have been divided into subsets, the machine learning model may be generated (1216) as disclosed herein at least with respect to machine learning model generation 818. Once the machine learning model is built, the model can be trained using the first subset of the training images (1218) as disclosed herein at least with respect to at least model training 832. Using the data techniques such as regression and others disclosed herein may be used to tune and optimize the model (1220) as disclosed herein at least with respect to tuning and optimization 838.

Once the model has been tuned and optimized, the second subset of data may be used to validate the model (1222). For example, data from the second subset of images may be fed into the machine learning model as inputs and a determination made as to how well the model predicts the build for the second subset of images. The process of training, tuning, and validating the model may be repeated to improve accuracy. Once the machine learning model is trained, tuned, and validated, the parameters, sometimes call evaluation metrics, may be finalized (1224). After the model has been finalized, a user, such as knit technicians or other person wanting to analyze a fabric sample, may utilize an interface process 1226 to determine the fabric sample's construction as disclosed with at least respect to user interface process 840.

Figure 14A:
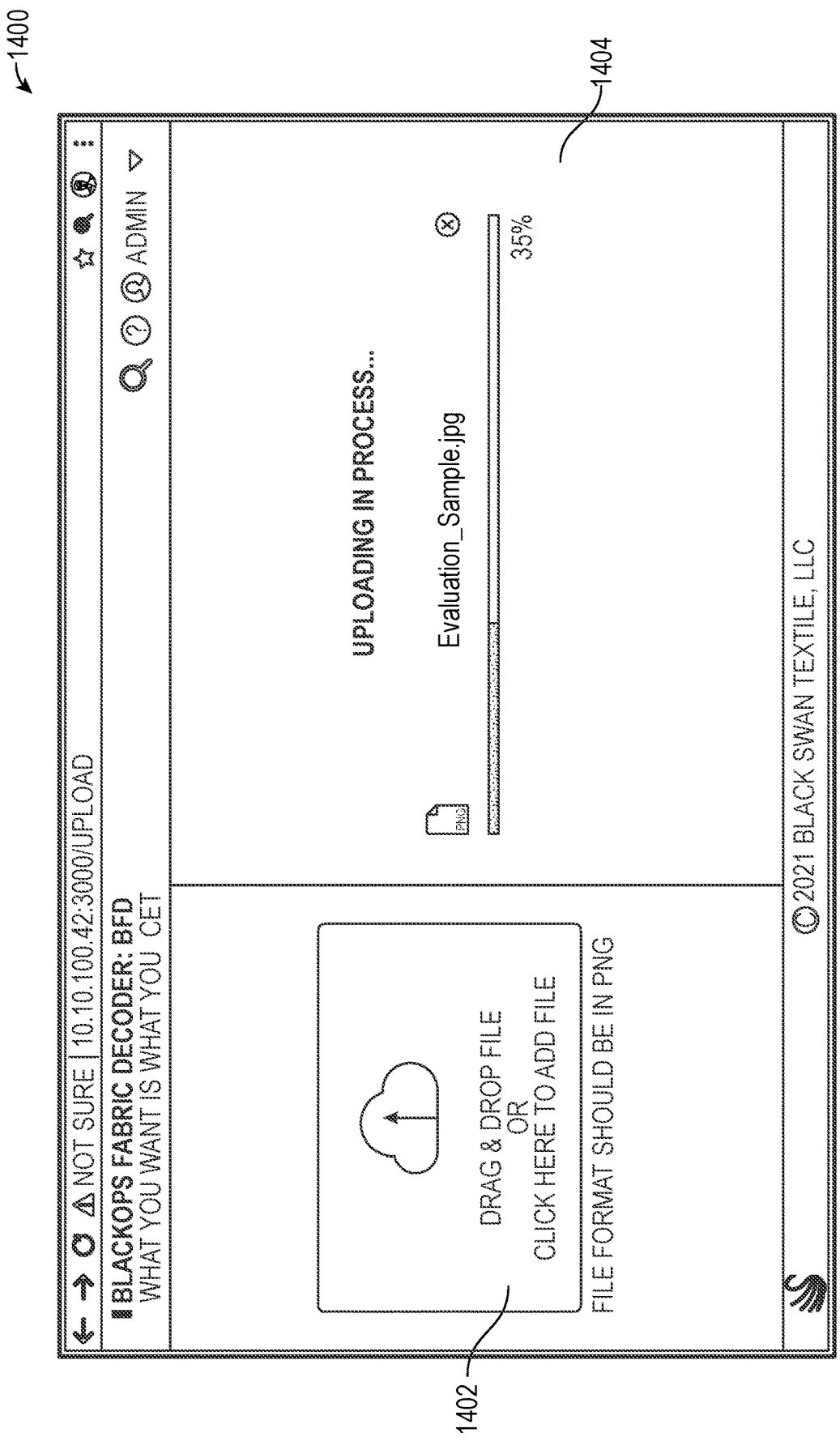
Figure 14B:
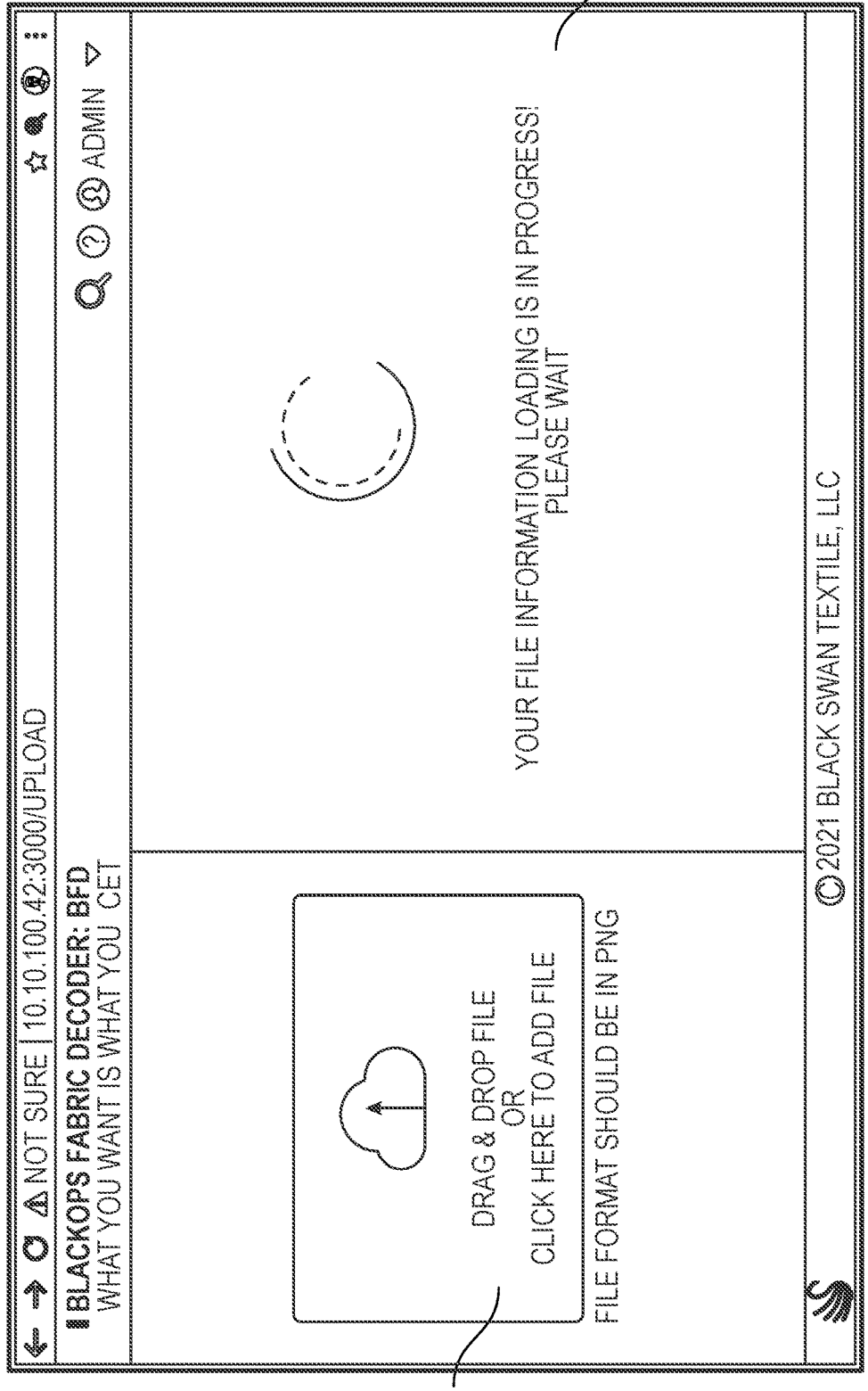

FIGS. 14A, 14B, and 14C show a graphical user interface (GUI) 1400 consistent with at least one embodiment of this disclosure. As shown in FIG. 14A, a user may use an upload area 1402 to upload an image of a sample fabric. The uploaded image may be received by a computing device as disclosed herein. GUI 1400 may also include an output area 1404 to output information to the user. As shown in FIG. 14A, output area 1404 may provide a status for an upload process.

As shown in FIG. 14B, output area 1404 may provide the user with a status of the identification process. Once the identification process is complete, output area 1404 may display a build sheet containing specifications for construction the fabric shown in the uploaded image. As shown in FIG. 14C, the build sheet may identify the stitch type, stich sequence, total courses, total wales, diameter of the yarns used to construct the fabric, courses and wales per inch. The output area may also display information for the uploaded file. The user may use the information displayed for the uploaded file to confirm the results are for the file upload in instances where multiple files are supplied by the user. The information in the build sheet may be transmitted to a knitting machine or otherwise used by a knit technician to set up a knitting machine to reproduce the sample fabric.

Figure 15:
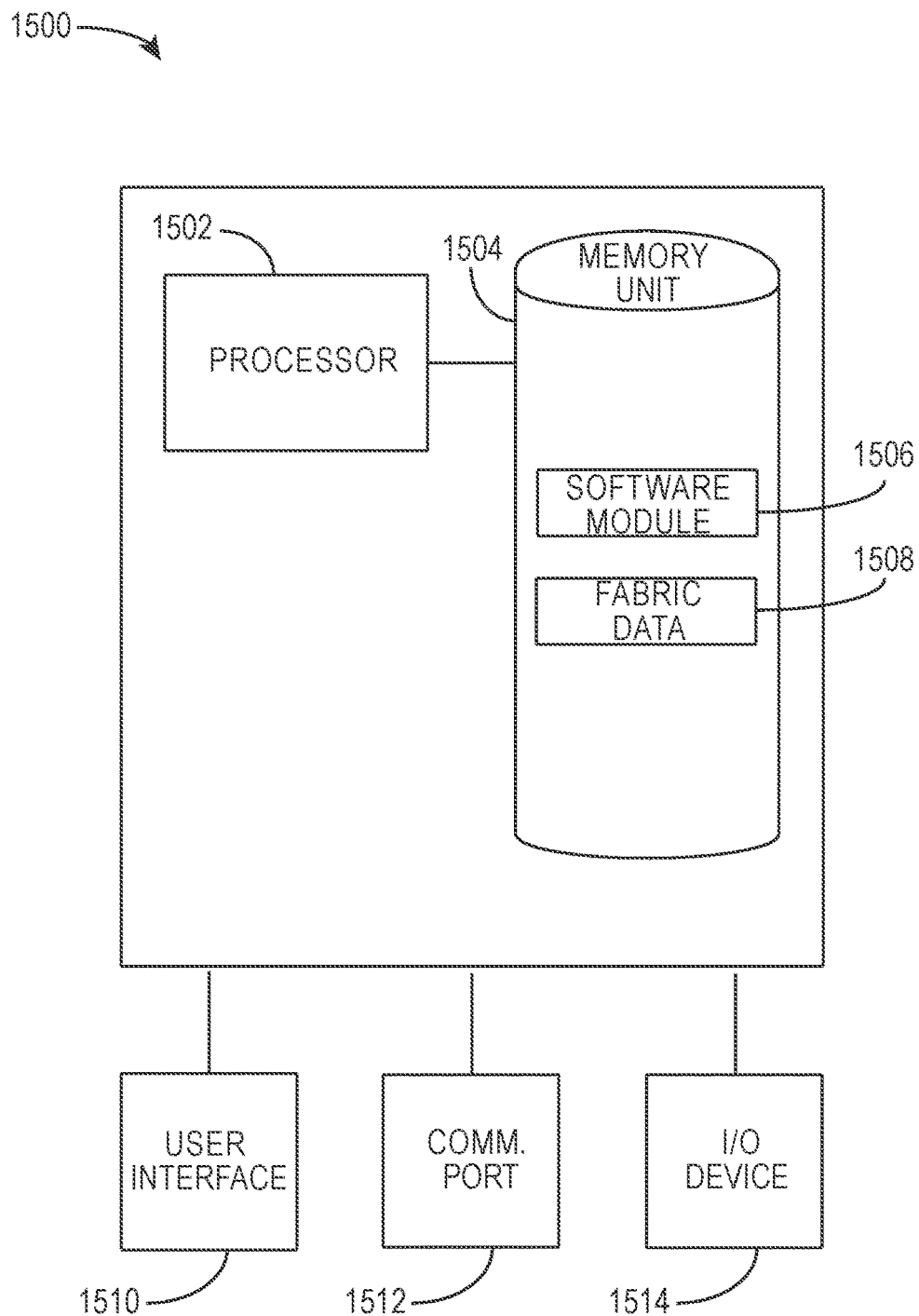
FIG. 15 shows a schematic of a computing device consistent with at least one embodiment of this disclosure.

FIG. 15 shows a schematic of a computing device 1500 consistent with at least one embodiment of this disclosure. Computing device 1500 may include a processor 1502 and a memory 1504. Memory 1504 may include a software module 1506 and fabric data 1508. While executing on processor 1502, software module 1504 may perform processes for generating machine learning models and/or determining fabric construction, including, for example, one or more stages included in the methods disclosed herein. Computing device 1500 also may include a user interface 1510, a communications port 1512, and an input/output (I/O) device 1514.

As disclosed herein, software module 1506 may include instructions that when executed by processor 1502 that cause processor 1502 to retrieve images and output build sheets as disclosed herein. For example, a user may use user interface 11510, which may display GUI 1500, to upload an image received by processor 1502 and display build sheets or other fabric data.

User interface 1510 can include any number of devices that allow a user to interface with computing device 1500. Non-limiting examples of user interface 1510 include a keypad, a microphone, a display (touchscreen or otherwise), etc.

Communications port 1512 may allow computing device 1500 to communicate with various information sources and devices, such as, but not limited to, remote computing devices such as servers or other remote computers maintained by fabric mills, clothing designers, etc. Non-limiting examples of communications port 1512 include, Ethernet cards (wireless or wired), Bluetooth® transmitters and receivers, near-field communications modules, etc.

I/O device 1514 may allow computing device 1500 to receive and output information. For example, I/O device 1514 may be a scanner that allows a user to directly upload an image for processing as disclosed herein. Non-limiting examples of I/O device 1514 include, a camera (still or video), fingerprint or other biometric scanners, etc.

EXAMPLES AND NOTES

The following, non-limiting examples, detail certain aspects of the present subject matter to solve the challenges and provide the benefits discussed herein, among others.

Example 1 is a method for analyzing fabric, the method comprising: receiving a digital image of at least a portion of a fabric sample; using a computer-based process, extracting one or more stitch parameters from the image; comparing the extracted one or more stitch parameters to parameters stored in a database of a plurality of build specifications, each of the plurality of build specifications associated with at least one of a plurality of known fabric constructions; and associating one or more fabrics with the digital image based on the comparison.

In Example 2, the subject matter of Example 1 optionally includes wherein the one or more stitch parameters include a stitch type.

In Example 3, the subject matter of Example 2 optionally includes wherein the stitch type includes at least one of a knit stitch, a tuck stitch, and a miss stitch.

In Example 4, the subject matter of any one or more of Examples 1-3 optionally include wherein extracting the one or more stitch parameters includes determining a courses per inch parameter.

In Example 5, the subject matter of any one or more of Examples 1~4 optionally include wherein extracting the one or more stitch parameters includes determining a wales per inch parameter.

In Example 6, the subject matter of any one or more of Examples 1-5 optionally include wherein extracting the one or more stitch parameters includes determining a yarn thickness for at least one strand of yarn.

In Example 7, the subject matter of any one or more of Examples 1-6 optionally include wherein extracting the one or more stitch parameters including performing an image analysis of the image to identify the one or more stitch parameters.

In Example 8, the subject matter of Example 7 optionally includes wherein performing the image analysis includes image subtracting utilizing the image of the fabric sample and an image of a known fabric sample.

In Example 9, the subject matter of any one or more of Examples 7-8 optionally include wherein performing the image analysis includes extracting a vertical and horizontal dimension from the image of the fabric sample.

In Example 10, the subject matter of any one or more of Examples 1-9 optionally include resizing the image of the fabric sample.

In Example 11, the subject matter of any one or more of Examples 1-10 optionally include converting a type of the image of the fabric sample from a first type to a second type.

In Example 12, the subject matter of any one or more of Examples 1-11 optionally include exporting the build specification to a fabric knitting machine.

In Example 13, the subject matter of any one or more of Examples 1-12 optionally include constructing a fabric based on the build specification.

Example 14 is at least one computer-readable medium comprising instructions to perform any of the methods of Examples 1-13.

Example 15 is an apparatus comprising means for performing any of the methods of Examples 1-13.

Example 16 is a system for analyzing a fabric, the system comprising: at least one processor; and at least one memory storing instructions that, when executed by the at least one processor, cause the at least one processor to perform actions comprising: receiving an image of a fabric sample, extracting one or more stitch parameters from the image, and selecting a build specification from a plurality of build specifications using at least one of the one or more stitch parameters, each of the plurality of build specifications associated with at least one of a plurality of known fabric constructions.

In Example 17, the subject matter of Example 16 optionally includes wherein the one or more stitch parameters include a stitch type.

In Example 18, the subject matter of Example 17 optionally includes wherein the stitch type includes at least one of a knit stitch, a tuck stitch, and a miss stitch.

In Example 19, the subject matter of any one or more of Examples 16-18 optionally include wherein extracting the one or more stitch parameters includes determining a courses per inch parameter.

In Example 20, the subject matter of any one or more of Examples 16-19 optionally include wherein extracting the one or more stitch parameters includes determining a wales per inch parameter.

In Example 21, the subject matter of any one or more of Examples 16-20 optionally include wherein extracting the one or more stitch parameters includes determining a yarn thickness for at least one strand of yarn.

In Example 22, the subject matter of any one or more of Examples 16-21 optionally include wherein extracting the one or more stitch parameters including performing an image analysis of the image to identify the one or more stitch parameters.

In Example 23, the subject matter of Example 22 optionally includes wherein performing the image analysis includes image subtracting utilizing the image of the fabric sample and an image of a known fabric sample.

In Example 24, the subject matter of any one or more of Examples 22-23 optionally include wherein performing the image analysis includes extracting a vertical and horizontal dimension from the image of the fabric sample.

In Example 25, the subject matter of any one or more of Examples 16-24 optionally include resizing the image of the fabric sample.

In Example 26, the subject matter of any one or more of Examples 16-25 optionally include converting a type of the image of the fabric sample from a first type to a second type.

Example 27 is they system of Example 16, further comprising exporting the build specification to a fabric knitting machine.

Example 28 is a method for training a machine learning model to recognize a fabric construction, the method comprising: receiving a first subset of training images; extracting one or more stitch parameters from each of the first subset of training images; mapping the one or more stitch parameters from each of the first subset of training images to a variable of the machine learning model; receiving a second subset of training images; extracting one or more stitch parameters from each of the second subset of training images; evaluating the machine learning model using the one or more stitch parameters extracted from each of the second subset of training images; receiving a confirmation that the machine learning model correctly identified a fabric construction for a majority of the second subset of training images; and exporting the machine learning model in response to receiving the confirmation.

In Example 29, the subject matter of Example 28 optionally includes wherein the one or more stitch parameters include a stitch type.

In Example 30, the subject matter of Example 29 optionally includes wherein the stitch type includes at least one of a knit stitch, a tuck stitch, and a miss stitch.

In Example 31, the subject matter of any one or more of Examples 28-30 optionally include wherein extracting the one or more stitch parameters includes determining a courses per inch parameter.

In Example 32, the subject matter of any one or more of Examples 28-31 optionally include wherein extracting the one or more stitch parameters includes determining a wales per inch parameter.

In Example 33, the subject matter of any one or more of Examples 28-32 optionally include wherein extracting the one or more stitch parameters includes determining a yarn thickness for at least one strand of yarn.

In Example 34, the subject matter of any one or more of Examples 28-33 optionally include wherein extracting the one or more stitch parameters including performing an image analysis of the image to identify the one or more stitch parameters.

In Example 35, the subject matter of Example 34 optionally includes wherein performing the image analysis includes image subtracting utilizing the image of the fabric sample and an image of a known fabric sample.

In Example 36, the subject matter of any one or more of Examples 34-35 optionally include wherein performing the image analysis includes extracting a vertical and horizontal dimension from the image of the fabric sample.

In Example 37, the subject matter of any one or more of Examples 28-36 optionally include resizing the image of the fabric sample.

In Example 38, the subject matter of any one or more of Examples 28-37 optionally include converting a type of the image of the fabric sample from a first type to a second type.

In Example 39, the subject matter of any one or more of Examples 28-38 optionally include removing duplicate images from the first subset of training images.

In Example 40, the subject matter of any one or more of Examples 28-39 optionally include removing duplicate images from the second subset of training images.

In Example 41, the subject matter of any one or more of Examples 28-40 optionally include wherein receiving the first and second subsets of training images comprises: receiving a plurality of images; and dividing the plurality of images into the first and second subsets of training images.

In Example 42, the subject matter of any one or more of Examples 28-41 optionally include wherein receiving the first and second subset of training images comprises generating the first and subset of training images.

Example 43 is at least one computer-readable medium comprising instructions to perform any of the methods of Examples 28-42.

Example 44 is an apparatus comprising means for performing any of the methods of Examples 28-42.

Example 45 is a system for training a machine learning model to recognize a fabric construction, the system comprising: at least one processor; and at least one memory storing instructions that, when executed by the at least one processor, cause the at least one processor to perform actions comprising: receiving a first subset of training imaging, extracting one or more stitch parameters from each of the first subset of training images, mapping the one or more stitch parameters from each of the first subset of training images to a variable of the machine learning model, receiving a second subset of training images, extracting one or more stitch parameters from each of the second subset of training images, evaluating the machine learning model using the one or more stitch parameters extracted from each of the second subset of training images, receiving a confirmation that the machine learning model correctly identified a fabric construction for a majority of the second subset of training images, and exporting the machine learning model in response to receiving the confirmation.

In Example 46, the subject matter of Example 45 optionally includes wherein the one or more stitch parameters include a stitch type.

In Example 47, the subject matter of Example 46 optionally includes wherein the stitch type includes at least one of a knit stitch, a tuck stitch, and a miss stitch.

In Example 48, the subject matter of any one or more of Examples 45-47 optionally include wherein extracting the one or more stitch parameters includes determining a courses per inch parameter.

In Example 49, the subject matter of any one or more of Examples 45-48 optionally include wherein extracting the one or more stitch parameters includes determining a wales per inch parameter.

In Example 50, the subject matter of any one or more of Examples 45-49 optionally include wherein extracting the one or more stitch parameters includes determining a yarn thickness for at least one strand of yarn.

In Example 51, the subject matter of any one or more of Examples 45-50 optionally include wherein extracting the one or more stitch parameters including performing an image analysis of the image to identify the one or more stitch parameters.

In Example 52, the subject matter of Example 51 optionally includes wherein performing the image analysis includes image subtracting utilizing the image of the fabric sample and an image of a known fabric sample.

In Example 53, the subject matter of any one or more of Examples 51-52 optionally include wherein performing the image analysis includes extracting a vertical and horizontal dimension from the image of the fabric sample.

In Example 54, the subject matter of any one or more of Examples 45-53 optionally include wherein the actions further comprise resizing the image of the fabric sample.

In Example 55, the subject matter of any one or more of Examples 45-54 optionally include wherein the actions further comprise converting a type of the image of the fabric sample from a first type to a second type.

In Example 56, the subject matter of any one or more of Examples 45-55 optionally include wherein the actions further comprise removing duplicate images from the first subset of training images.

In Example 57, the subject matter of any one or more of Examples 45-56 optionally include wherein the actions further comprise removing duplicate images from the second subset of training images.

In Example 58, the subject matter of any one or more of Examples 45-57 optionally include wherein receiving the first and second subsets of training images comprises: receiving a plurality of images; and dividing the plurality of images into the first and second subsets of training images.

In Example 59, the subject matter of any one or more of Examples 45-58 optionally include wherein receiving the first and second subset of training images comprises generating the first and subset of training images.

In Example 60, the apparatuses or methods of any one or any combination of Examples 1-59 can optionally be configured such that all elements or options recited are available to use or select from.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

The scope of the invention should be determined with reference to the appended claims, along with the full scope of equivalents to which such claims are entitled.

The invention claimed is:

1. A method for training a machine learning model to recognize a fabric construction, the method comprising:
    receiving a first subset of training images;
    extracting stitch parameters including a stitch type, a courses per inch parameter, a wales per inch parameter and a yarn thickness for at least one strand of yarn from each of the first subset of training images;
    mapping the stitch parameters from each of the first subset of training images to a variable of the machine learning model;
    receiving a second subset of training images;
    extracting the stitch parameters from each of the second subset of training images;
    evaluating the machine learning model using the stitch parameters extracted from each of the second subset of training images;
    receiving a confirmation that the machine learning model correctly identified a fabric construction for a majority of the second subset of training images; and
    exporting the machine learning model in response to receiving the confirmation.

2. The method of claim 1, wherein extracting the stitch parameters including performing an image analysis of the image to identify the stitch parameters.

3. The method of claim 1, further comprising resizing the image of the fabric sample.

4. The method of claim 1, further comprising converting a type of the image of the fabric sample from a first type to a second type.

5. The method of claim 1, further comprising removing duplicate images from the first subset of training images.

6. The method of claim 1, further comprising removing duplicate images from the second subset of training images.

7. The method of claim 1, wherein receiving the first and second subsets of training images comprises:
    receiving a plurality of images; and
    dividing the plurality of images into the first and second subsets of training images.

8. The method of claim 1, wherein receiving the first and second subset of training images comprises generating the first and second subset of training images.

9. A system for training a machine learning model to recognize a fabric construction, the system comprising:
    at least one processor; and
    at least one memory storing instructions that, when executed by the at least one processor, cause the at least one processor to perform actions comprising:
        receiving a first subset of training imaging,
        extracting stitch parameters including a stitch type, a courses per inch parameter, a wales per inch parameter and a yarn thickness for at least one strand of yarn from each of the first subset of training images, mapping the stitch parameters from each of the first subset of training images to a variable of the machine learning model, receiving a second subset of training images, extracting the stitch parameters from each of the second subset of training images, evaluating the machine learning model using the stitch parameters extracted from each of the second subset of training images, receiving a confirmation that the machine learning model correctly identified a fabric construction for a majority of the second subset of training images, and exporting the machine learning model in response to receiving the confirmation.

10. The system of claim 9, wherein extracting the stitch parameters including performing an image analysis of the image to identify the stitch parameters.

11. The system of claim 10, wherein performing the image analysis includes image subtracting utilizing the image of the fabric sample and an image of a known fabric sample.

12. The system of claim 9, wherein performing the image analysis includes extracting a vertical and horizontal dimension from the image of the fabric sample.

13. The system of claim 9, wherein herein the actions further comprise resizing the image of the fabric sample.

14. The system of claim 9, wherein the actions further comprise converting a type of the image of the fabric sample from a first type to a second type.

15. The system of claim 9, wherein the actions further comprise removing duplicate images from the first subset of training images and the second subset of training images.

16. The system of claim 9, wherein receiving the first and second subsets of training images comprises:

receiving a plurality of images; and dividing the plurality of images into the first and second subsets of training images.

17. The system of claim 9, wherein receiving the first and second subset of training images comprises generating the first and second subset of training images.

* * * * *

UNITED STATES PATENT AND TRADEMARK OFFICE
CERTIFICATE OF CORRECTION

| | |
|---|---|
| PATENT NO. | : 11,847,842 B2 |
| APPLICATION NO. | : 17/453976 |
| DATED | : December 19, 2023 |
| INVENTOR(S) | : Keith Hoover |

It is certified that error appears in the above-identified patent and that said Letters Patent is hereby corrected as shown below:

In the Claims

In Column 26, Line 4, in Claim 13, before "the actions", delete "herein"

Signed and Sealed this
Sixteenth Day of April, 2024

Katherine Kelly Vidal
*Director of the United States Patent and Trademark Office*